United States Patent
Miyairi

(10) Patent No.: US 8,664,078 B2
(45) Date of Patent: Mar. 4, 2014

(54) MANUFACTURING METHOD OF SEMICONDUCTOR DEVICE ON CAVITIES

(75) Inventor: Hidekazu Miyairi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 750 days.

(21) Appl. No.: 12/053,745

(22) Filed: Mar. 24, 2008

(65) Prior Publication Data

US 2008/0265323 A1 Oct. 30, 2008

(30) Foreign Application Priority Data

Apr. 27, 2007 (JP) ................. 2007-118086

(51) Int. Cl.
*H01L 21/76* (2006.01)
*H01L 21/30* (2006.01)
*H01L 21/46* (2006.01)

(52) U.S. Cl.
USPC ........... 438/411; 438/406; 438/407; 438/455; 438/459; 257/E21.564

(58) Field of Classification Search
USPC ................. 438/411, 459, 406, 407, 455; 257/E21.564
See application file for complete search history.

(56) References Cited

U.S. PATENT DOCUMENTS

| | | | | |
|---|---|---|---|---|
| 5,374,564 | A * | 12/1994 | Bruel ............................. | 438/455 |
| 5,804,086 | A * | 9/1998 | Bruel ............................. | 216/33 |
| 5,895,766 | A * | 4/1999 | Manning ....................... | 438/305 |
| 5,953,622 | A * | 9/1999 | Lee et al. ...................... | 438/458 |
| 5,965,918 | A | 10/1999 | Ono | |
| 6,191,007 | B1 * | 2/2001 | Matsui et al. ................. | 438/459 |
| 6,958,255 | B2 * | 10/2005 | Khuri-Yakub et al. ......... | 438/48 |
| 7,019,364 | B1 | 3/2006 | Sato et al. | |
| 7,033,868 | B2 | 4/2006 | Nakamura et al. | |
| 7,235,456 | B2 | 6/2007 | Sato et al. | |
| 7,253,082 | B2 | 8/2007 | Adachi et al. | |
| 7,534,687 | B2 | 5/2009 | Hara | |
| 8,212,319 | B2 | 7/2012 | Miyairi | |
| 2004/0217434 | A1 | 11/2004 | Lee et al. | |
| 2006/0138541 | A1 | 6/2006 | Nakamura et al. | |
| 2008/0003771 | A1 | 1/2008 | Sato et al. | |
| 2008/0116522 | A1 | 5/2008 | Zhu | |
| 2008/0194065 | A1 | 8/2008 | Lee et al. | |

FOREIGN PATENT DOCUMENTS

| | | |
|---|---|---|
| JP | 11-274500 | 10/1999 |
| JP | 2001-144276 | 5/2001 |
| JP | 2002-343977 | 11/2002 |
| JP | 2004-146461 | 5/2004 |
| JP | 2004-221530 | 8/2004 |
| JP | 2004-336052 | 11/2004 |
| JP | 2005-101234 | 4/2005 |
| JP | 2007-27232 | 2/2007 |

* cited by examiner

*Primary Examiner* — Shouxiang Hu
(74) *Attorney, Agent, or Firm* — Husch Blackwell LLP

(57) ABSTRACT

An object is to provide a semiconductor device in which, through a simpler process, junction capacitance and power consumption can be reduced more than a conventional semiconductor device, and a manufacturing method thereof. An insulating film including an opening is formed over a base substrate and a part of a bond substrate is transferred to the base substrate, with the insulating film interposed therebetween, whereby a semiconductor film including a cavity between the semiconductor film and the base substrate is formed over the base substrate. Then, a semiconductor device including a semiconductor element such as a transistor is manufactured using the semiconductor film. The transistor includes a cavity between the base substrate and the semiconductor film used as an active layer. One cavity may be provided or a plurality of cavities may be provided.

11 Claims, 20 Drawing Sheets

MANUFACTURING METHOD OF SEMICONDUCTOR DEVICE ON CAVITIES

BACKGROUND OF THE INVENTION

1. Field of the Invention

The present invention relates to a semiconductor device using an SOI (silicon on insulator) substrate and a manufacturing method of the semiconductor device. In particular, the present invention relates to a bonding SOI technique, a semiconductor device using an SOI substrate which is obtained in such a manner that a single crystal semiconductor film or a polycrystalline semiconductor film is bonded to a substrate with an insulating film interposed therebetween, and a manufacturing method of the semiconductor device.

2. Description of the Related Art

Demands for higher integration, higher operation speed, higher performance, and lower power consumption have been more stringent, and in response to the above-described demands, a transistor using an SOI substrate has attracted an attention as effective means that can take the place of a bulk transistor. Higher operation speed and lower power consumption can be expected more in the transistor using the SOI substrate than in the bulk transistor because an insulating film is formed over a semiconductor film in the transistor using the SOI substrate, and accordingly parasitic capacitance can be reduced and generation of leakage current flowing through the substrate can be suppressed. In addition, since the semiconductor film used as an active layer can be thinned, a short channel effect can be suppressed; thus, an element can be miniaturized, and accordingly higher integration of a semiconductor integrated circuit can be realized. Moreover, since the transistor using the SOI substrate is completely latch-up free, there is no possibility that the element is broken due to heat caused by latch-up. Furthermore, the transistor using the SOI substrate does not need element separation unlike the bulk transistor; thus, the transistor using the SOI substrate has advantages in that distance between the elements can be shortened and higher integration can be realized.

As one of manufacturing methods of an SOI substrate, there is a method in which a semiconductor film is bonded to a substrate with an insulating film interposed therebetween, such as UNIBOND (registered trademark) typified by Smart Cut (registered trademark), ELTRAN (epitaxial layer transfer), a dielectric separation method, or a PACE (plasma assisted chemical etching) method. The above-described bonding methods make it possible to form a high-performance integrated circuit, in which a single crystal semiconductor film is used, over all kinds of substrates.

However, in the transistor using the SOI substrate, junction capacitance is formed between an impurity region of the semiconductor film and the substrate. Reduction in the junction capacitance is a very important object for realization of further reduction in power consumption of a semiconductor integrated circuit. It is desired that a material having low permittivity while keeping its insulating property be used for the insulating film interposed between the impurity region and the substrate.

In Patent Document 1 (Japanese Published Patent Application No. 2001-144276), a transistor having an SON (silicon on nothing) structure in which a hollow space is provided between a semiconductor film and a substrate is described. In addition, in Patent Document 2 (Japanese Published Patent Application No. 2004-146461), a structure of an SOI substrate in which a cavity is provided between a semiconductor film and a substrate is described. The substrate and the semiconductor film are insulated from each other with use of air, relative permittivity of which is 1, whereby junction capacitance can be reduced.

SUMMARY OF THE INVENTION

However, as for the transistor having the SON structure described in Patent Document 1, a great amount of hydrogen gas, which requires careful handling in a manufacturing process, is used, and furthermore the transistor is needed to be formed through a complicated process due to difficulty in control of the thickness of the semiconductor film and the position of a cavity. Moreover, there is a problem in that characteristics of elements vary because the crystallinity of a region in the semiconductor film where crystal growth progresses and crystals meet each other is inferior to the crystallinity of the other region, and high yield is difficult to be obtained. On the other hand, there is room, on the SOI substrate described in Patent Document 1, for reduction in the junction capacitance of a transistor having an SON structure, which is to be formed.

In view of the foregoing problems, it is an object of the present invention to propose a semiconductor device in which, through a simpler process, junction capacitance and power consumption can be reduced more than in a conventional semiconductor device, and a manufacturing method of the semiconductor device.

In the present invention, an insulating film including an opening is formed over a base substrate (a supporting substrate) and part of a bond substrate (a semiconductor substrate) is transferred to the base substrate with the insulating film interposed therebetween, whereby a semiconductor film having a cavity between the semiconductor film and the base substrate is formed over the base substrate. Then, a semiconductor device including a semiconductor element such as a transistor is manufactured using the semiconductor film. Specifically, the transistor included in the semiconductor device of the present invention includes the cavity formed with the opening included in the insulating film, between the base substrate and the semiconductor film used as an active layer. One cavity may be provided or a plurality of cavities may be provided. In addition, the cavity may be formed so as to overlap with a channel formation region of the semiconductor film, may be formed so as to overlap either one of a source or a drain, or may be formed so as to overlap with a source, a drain, and a channel formation region.

In a manufacturing method of a semiconductor device of the present invention, an insulating film including an opening which is to be used as a cavity later is formed over a base substrate and then a bond substrate and the base substrate are bonded to each other so that the opening faces the bond substrate, whereby the cavity is formed between the bond substrate and the base substrate. Then, the bond substrate is split so that part of the bond substrate remains over the base substrate, and a semiconductor film is formed over the base substrate so that the cavity is included between the semiconductor film and the base substrate. After that, the semiconductor film is processed into a desired shape while the cavity is kept between the semiconductor film and the base substrate, whereby a semiconductor element such as a transistor is formed.

In a transistor included in a semiconductor device of the present invention, a semiconductor film and a cavity are in contact with each other. Thus, parasitic capacitance or junction capacitance of the transistor can be reduced when the cavity is filled with air, nitrogen, an inert gas, or the like that has lower relative permittivity than an inorganic insulating film of silicon oxide or the like. Thus, reduction in power consumption of the semiconductor device can be realized.

Since an opening can be formed by a method which has already been established, such as etching, in a manufacturing method of the present invention, a cavity with a desired depth and a desired shape can be formed precisely by a safe and simple manufacturing method. Therefore, the cost of manufacture of a semiconductor device can be reduced and yield can be increased.

DETAILED DESCRIPTION OF THE INVENTION

Embodiment Mode

Embodiment Modes of the present invention will be hereinafter described with reference to the accompanying drawings. However, the present invention can be carried out in many different modes and it is easily understood by those skilled in the art that modes and details of the present invention can be modified in various ways without departing from the purpose and scope of the present invention. Therefore, the present invention should not be interpreted as being limited to the following description of Embodiment Modes.

Embodiment Mode 1

A structure of a semiconductor film included in a semiconductor element in a semiconductor device of the present invention will be described with reference to FIG. 1A.

Figure 1A:
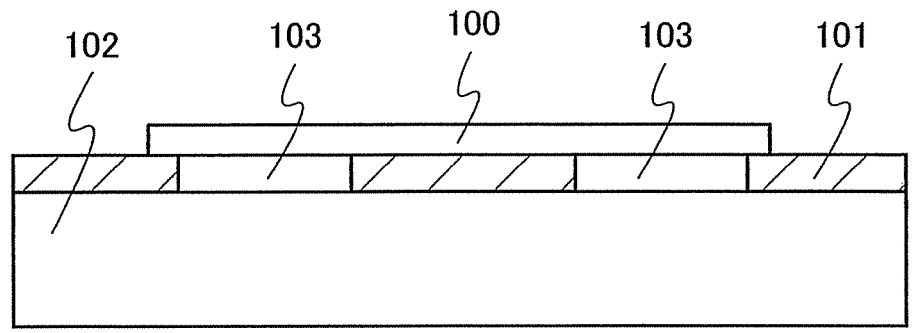
FIGS. 1A to 1C are cross-sectional views showing structures of a transistor included in a semiconductor device of the present invention.

A semiconductor film 100 shown in FIG. 1A is formed over a base substrate 102 so that an insulating film 101 is interposed therebetween. The insulating film 101 and the semiconductor film 100 are bonded to each other, whereby the semiconductor film 100 can be bonded to the base substrate 102. The insulating film 101 includes at least one opening, which forms a cavity 103 between the semiconductor film 100 and the base substrate 102. A part of the cavity 103 or the whole cavity 103 overlaps with a part of the semiconductor film 100, and thus at least a part of the insulating film 101 overlaps with the semiconductor film 100 at a region of the insulating film 101 other than the opening. The number of cavities 103 is not limited to the structure shown in FIG. 1A. One cavity 103 or a plurality of cavities 103 may be provided between the semiconductor film 100 and the base substrate 102.

The insulating film 101 may be formed of one insulating film or may be formed so that a plurality of insulating films are stacked.

The insulating film 101 may be formed over an entire surface of the base substrate 102 excluding a portion where the opening is formed, or the insulating film 101 may be formed partially so that at least part of the insulating film 101 is in contact with the semiconductor film 100. Although the base substrate 102 is exposed in the opening formed in the insulating film 101 in FIG. 1A, the present invention is not limited to this structure. The insulating film 101 may be formed over the base substrate 102 also in the opening.

Figure 1B:
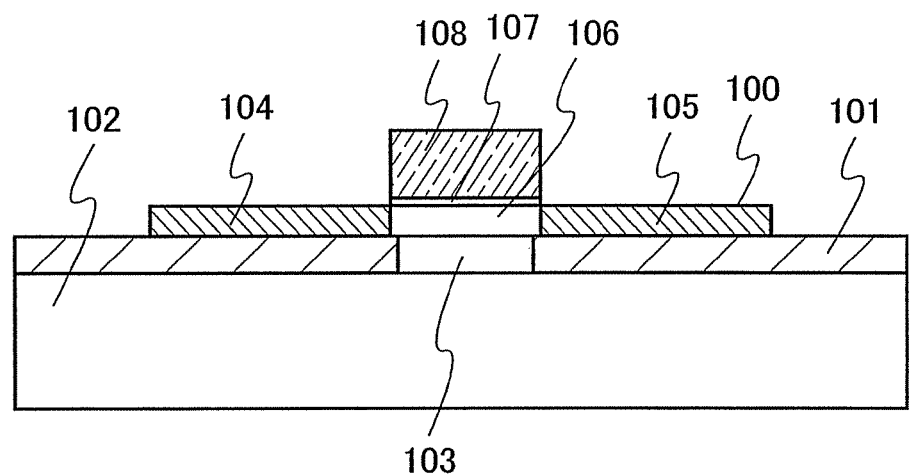

Next, a structure of a transistor, which is one of semiconductor elements using the semiconductor film 100 shown in FIG. 1A is described. FIG. 1B shows an example of a cross-sectional view of the transistor formed using the semiconductor film 100. The transistor shown in FIG. 1B includes the semiconductor film 100 in which a pair of impurity regions 104 and 105, one of which functions as a source and the other as a drain, and a channel formation region 106 are included. In addition, the transistor shown in FIG. 1B includes an electrode 108 which functions as a gate so that the electrode 108 overlaps with the channel formation region 106 with a gate insulating film 107 interposed therebetween.

In a transistor shown in FIG. 1B, the cavity 103 is provided at a position overlapping with the channel formation region 106 and an electrode 108. Note that, in the present invention, the position of the cavity is not limited to the structure shown in FIG. 1B. The cavity may be formed so as to overlap with one of the pair of impurity regions 104 and 105, or may be formed so as to overlap with the pair of impurity regions 104 and 105 and the channel formation region 106. Self-heating can be suppressed more in the case where the cavity is formed so as to overlap with at least the channel formation region 106 than in the case where the cavity is formed so as to overlap with only the impurity regions 104 and 105.

Figure 1C:
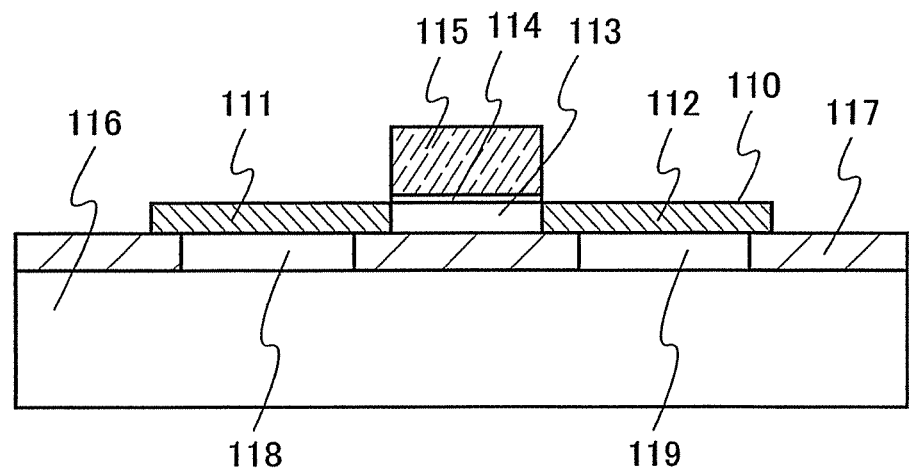

Next, a structure of a transistor using a semiconductor film 110 which is formed so as to overlap with two cavities is described. FIG. 1C shows an example of a cross-sectional view of a transistor which is formed using the semiconductor film 110 which overlaps with two cavities. The transistor shown in FIG. 1C includes the semiconductor film 110 in which a pair of impurity regions 111 and 112, one of which functions as a source and the other as a drain, and a channel formation region 113 are included. The transistor shown in FIG. 1C includes an electrode 115 which functions as a gate so that the electrode 115 overlaps with the channel formation region 113 with a gate insulating film 114 interposed therebetween.

The transistor shown in FIG. 1C includes cavities 118 and 119 which are formed with openings included in an insulating film 117, between the semiconductor film 110 and a base substrate 116. The cavities 118 and 119 are formed at positions overlapping with the pair of impurity regions 111 and 112, respectively. Junction capacitance of the transistor can be reduced more in the case where the cavities 118 and 119 overlap with at least the impurity regions 111 and 112, respectively, than in the case where a cavity which overlaps with only the channel formation region 113 is formed.

In the transistor included in the semiconductor device of the present invention, the cavity 103 is included between the semiconductor film 100 and the base substrate 102, and the semiconductor film 100 is in contact with the cavity 103. In addition, in the transistor included in the semiconductor device of the present invention, the cavities 118 and 119 are included between the semiconductor film 110 and the base substrate 116, and the semiconductor film 110 is in contact with the cavities 118 and 119. Thus, the cavities 103, 118, and 119 are filled with air, nitrogen, an inert gas, or the like that has lower relative permittivity than an inorganic insulating film of silicon oxide or the like, whereby parasitic capacitance or junction capacitance of the transistor can be reduced. It is desirable that the percentage of moisture contained in the above-described gas be decreased in order to suppress volume expansion with temperature change. Note that, in fact, a natural oxide film is formed, in some cases, in a portion of the semiconductor film 100, which is in contact with the cavity 103 and a portion of the semiconductor film 110, which is in contact with the cavities 118 and 119. However, an insulating film described in Patent Document 2 is supposed to have a thickness of several μm to several hundreds μm, and the natural oxide film is about several nm thick, which is remarkably thinner than the insulating film. Thus, it can be said that parasitic capacitance or junction capacitance of the transistor can be reduced more in the present invention than in the case where the insulating film is formed to the above-described thickness in the portion of the semiconductor film 100, which is in contact with the cavity 103 and the portion of the semiconductor film 110, which is in contact with the cavities 118 and 119.

Note that, although the case where the cavities 103, 118, and 119 are filled with gas is described in this embodiment mode, the present invention is not limited to this structure. For example, the cavities 103, 118, and 119 may be filled with a material that has lower relative permittivity than an inorganic insulating film of silicon oxide or the like, for example, a porous insulating film (a porous material) including a large number of pores therein.

Note that as the semiconductor device included in the category of the present invention, there are all kinds of semiconductor devices such as microprocessors, integrated circuits such as image processing circuits, and semiconductor display devices. The semiconductor display devices include the following in its category: liquid crystal display devices, light-emitting devices in which a light-emitting element typified by an organic light-emitting element (OLED) is provided for each pixel, DMDs (digital micromirror devices), PDPs (plasma display panels), FEDs (field emission displays), or other display devices in which a circuit element using a semiconductor film is included in a driver circuit.

Embodiment Mode 2

In this embodiment mode, a structure of a transistor included in a semiconductor device of the present invention will be described more specifically.

Figure 2A:
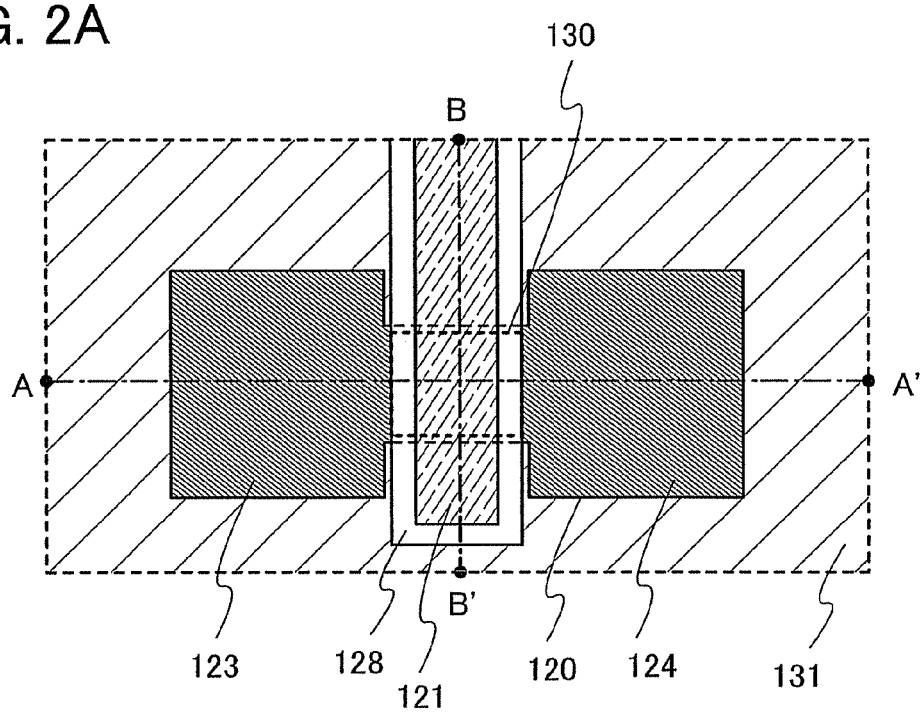
FIG. 2A is a top view showing a structure of a transistor included in a semiconductor device of the present invention and FIGS. 2B and 2C are cross-sectional views showing the same.
Figure 2B:
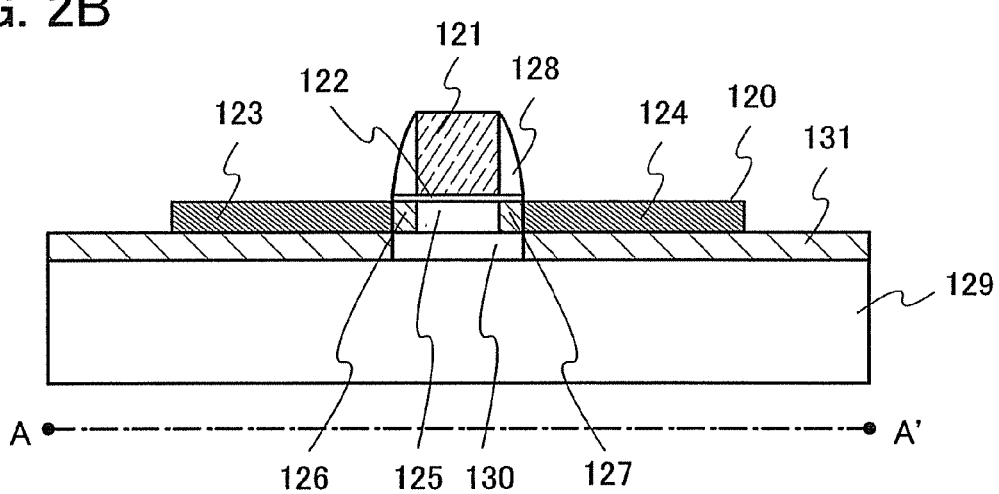
Figure 2C:
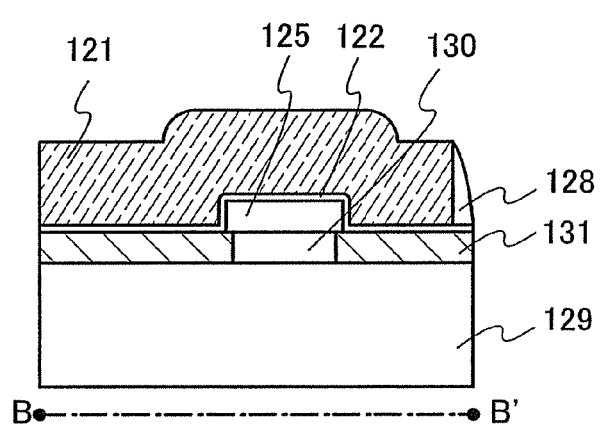

FIG. 2A shows an example of a top view of a transistor included in a semiconductor device of the present invention and FIGS. 2B and 2C each show an example of a cross-sectional view thereof. FIG. 2A is a top view of the transistor, FIG. 2B is a cross-sectional view taken along line A-A' in FIG. 2A, and FIG. 2C is a cross-sectional view taken along line B-B' in FIG. 2A.

The transistor shown in FIGS. 2A to 2C includes a semiconductor film 120 functioning as an active layer, an electrode 121, a portion of which overlapping with the semiconductor film 120 functions as a gate, and a gate insulating film 122 provided between the semiconductor film 120 and the electrode 121. The semiconductor film 120 includes impurity regions 123 and 124, one of which functions as a source and the other as a drain, a channel formation region 125, and LDD (lightly doped drain) regions 126 and 127 provided respectively between the impurity region 123 and the channel formation region 125 and between the impurity region 124 and the channel formation region 125.

An insulating film 131 is formed between the semiconductor film 120 and a base substrate 129. One cavity 130 is formed between the semiconductor film 120 and the base substrate 129 with an opening included in the insulating film 131. In FIGS. 2A to 2C, the cavity 130 fits completely inside a region overlapping with the semiconductor film 120. In addition, the cavity 130 overlaps with the channel formation region 125 in the semiconductor film 120. Self-heating can be suppressed more in the case where the cavity is formed so as to overlap with at least the channel formation region 125 than in the case where the cavity is formed so as to overlap with only the impurity regions 123 and 124.

Note that, although the cavity 130 fits completely inside the region overlapping with the semiconductor film 120 in FIGS. 2A to 2C, the present invention is not limited to this structure. The cavity may be extended to the outside of the region overlapping with the semiconductor film 120. In this case, the cavity 130 has an opening outside the region overlapping with the semiconductor film 120. When the cavity 130 has the opening, there is no difference in atmospheric pressure between the inside and outside of the cavity 130. Thus, even if temperature of heat treatment is changed rapidly, the semiconductor film 120 can be prevented from being transformed.

Note that, although the semiconductor film 120 of the transistor shown in FIGS. 2A to 2C includes the LDD regions 126 and 127, the present invention is not limited to this structure. The LDD regions 126 and 127 are not necessarily provided, or either one of the LDD region 126 or the LDD region 127 may be provided. In addition, although in the transistor shown in FIGS. 2A to 2C, the LDD regions 126 and 127 are provided in regions other than the region in the semiconductor film 120, which overlaps with the electrode 121, the present invention is not limited to this structure. The LDD regions 126 and 127 may be provided in regions overlapping with the electrode 121. Alternatively, the LDD regions 126 and 127 may be provided so as to extend to the region overlapping with the electrode 121 and a region other than the aforementioned region.

In addition, although a sidewall 128 which is used as a mask when the LDD regions 126 and 127 are formed is provided on sides of the electrode 121 in the transistor shown in FIGS. 2A to 2C, the present invention is not limited to this structure.

Figure 3A:
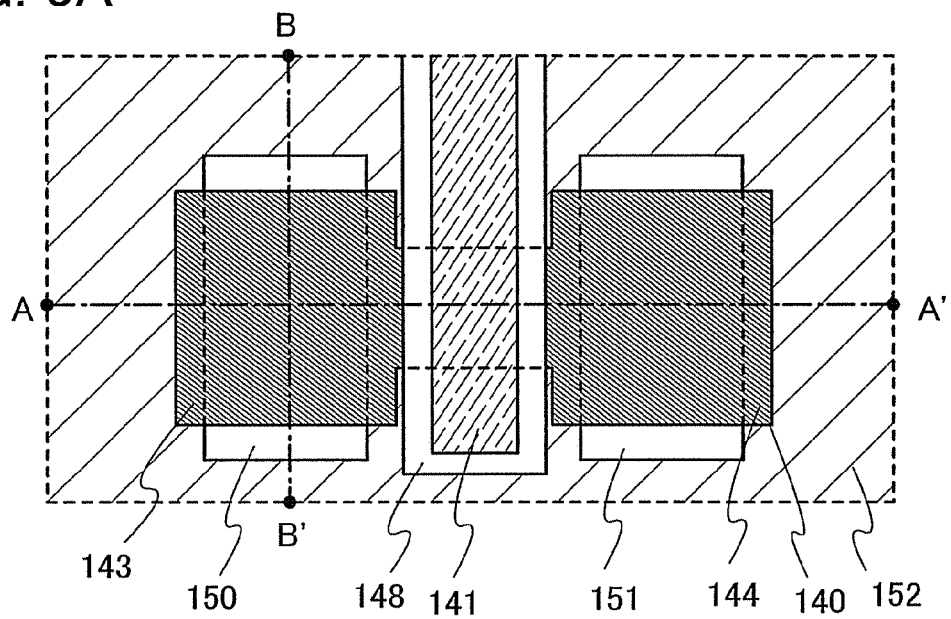
FIG. 3A is a top view showing a structure of a transistor included in a semiconductor device of the present invention and FIGS. 3B and 3C are cross-sectional views showing the same.
Figure 3B:
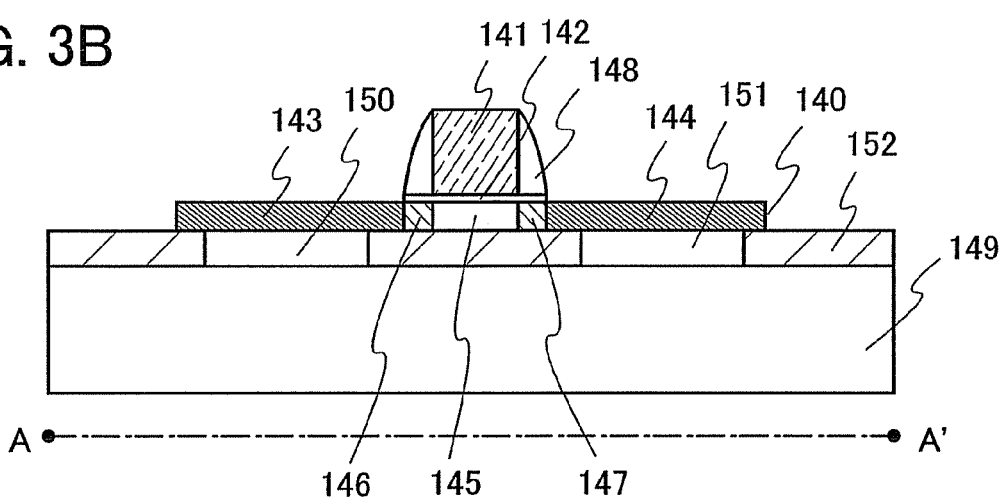
Figure 3C:
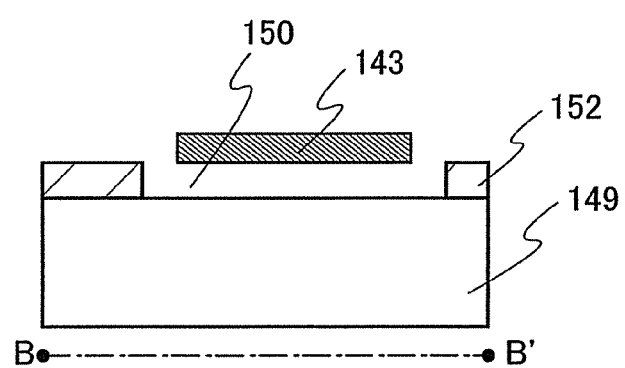

FIG. 3A shows an example of a top view of a transistor included in a semiconductor device of the present invention and FIGS. 3B and 3C each show an example of a cross-sectional view thereof. FIG. 3A is a top view of the transistor, FIG. 3B is a cross-sectional view taken along line A-A' in FIG. 3A, and FIG. 3C is a cross-sectional view taken along line B-B' in FIG. 3A.

The transistor shown in FIGS. 3A to 3C includes a semiconductor film 140 functioning as an active layer, an electrode 141, a portion of which overlapping with the semiconductor film 140 functions as a gate, and a gate insulating film 142 provided between the semiconductor film 140 and the electrode 141. The semiconductor film 140 includes impurity regions 143 and 144, one of which functions as a source and the other as a drain, a channel formation region 145, and LDD (lightly doped drain) regions 146 and 147 provided respectively between the impurity region 143 and the channel formation region 145 and between the impurity region 144 and the channel formation region 145.

An insulating film 152 is formed between the semiconductor film 140 and a base substrate 149. Two cavities 150 and 151 are formed between the semiconductor film 140 and the base substrate 149 with openings included in the insulating film 152. The cavity 150 overlaps with the impurity region 143, and the cavity 151 overlaps with the impurity region 144. Junction capacitance of the transistor can be reduced more in the case where the cavities 150 and 151 overlap with at least the impurity regions 143 and 144, respectively, than in the case where a cavity which overlaps with only the channel formation region 145 is formed. Note that the cavities 150 and 151 may completely fit inside a region overlapping with the semiconductor film 140, or may be extended to the outside of the region overlapping with the semiconductor film 140 as shown in FIGS. 3A to 3C. In the latter case, the cavities 150 and 151 have openings outside the region overlapping with the semiconductor film 140. When the cavities 150 and 151 have the openings, there is no difference in atmospheric pressure between the inside and outside of the cavities 150 and 151. Thus, even if temperature of heat treatment is changed rapidly, the semiconductor film 140 can be prevented from being transformed.

Note that, although the semiconductor film 140 of the transistor shown in FIGS. 3A to 3C includes the LDD regions 146 and 147, the present invention is not limited to this structure. The LDD regions 146 and 147 are not necessarily provided, or either one of the LDD region 146 or the LDD region 147 may be provided. In addition, although in the transistor shown in FIGS. 3A to 3C, the LDD regions 146 and 147 are provided in regions other than the region in the semiconductor film 140, which overlaps with the electrode 141, the present invention is not limited to this structure. The LDD regions 146 and 147 may be provided in regions overlapping with the electrode 141. Alternatively, the LDD regions 146 and 147 may be provided so as to extend to the region overlapping with the electrode 141 and a region other than the aforementioned region.

In addition, although a sidewall 148 which is used as a mask when the LDD regions 146 and 147 are formed is provided on sides of the electrode 141 in the transistor shown in FIGS. 3A and 3B, the present invention is not limited to this structure.

Figure 4A:
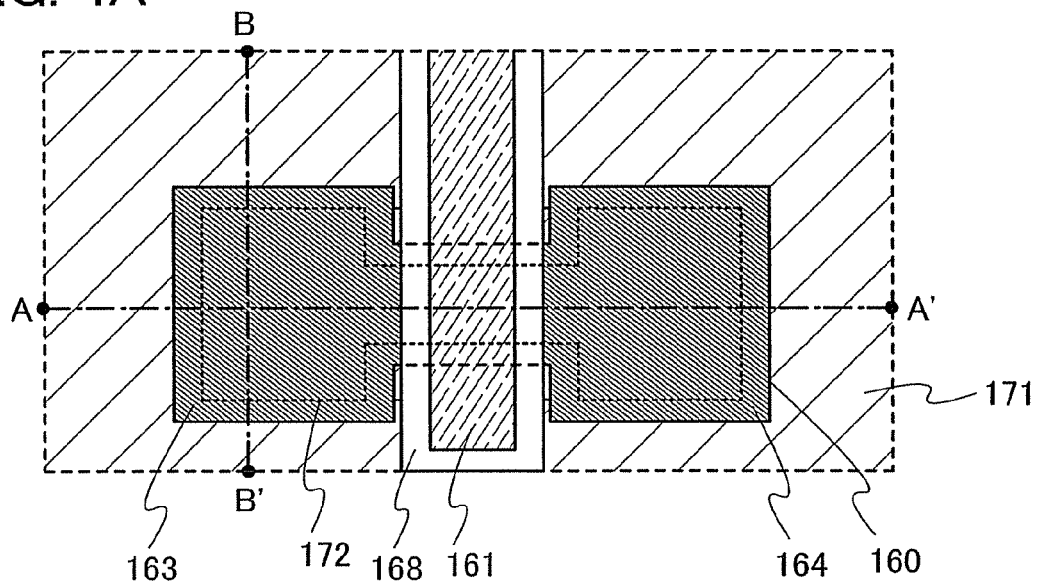
FIG. 4A is a top view showing a structure of a transistor included in a semiconductor device of the present invention and FIGS. 4B and 4C are cross-sectional views showing the same.
Figure 4B:
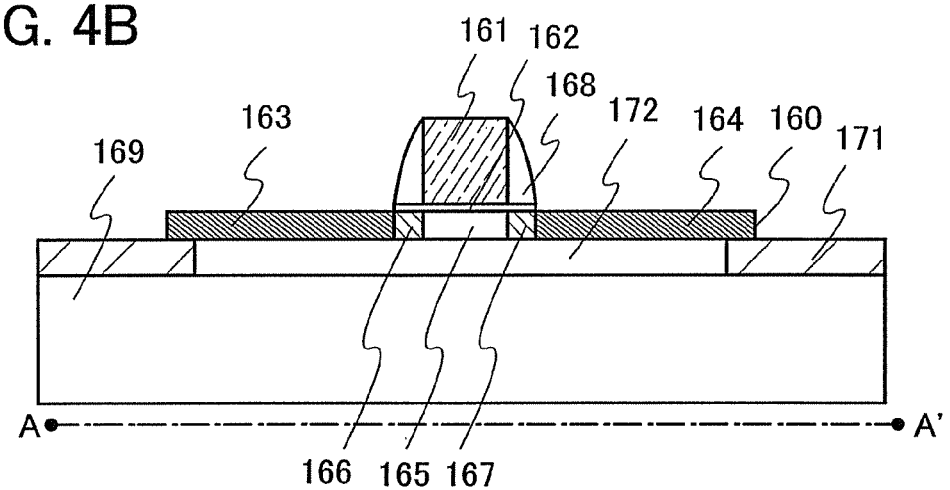
Figure 4C:
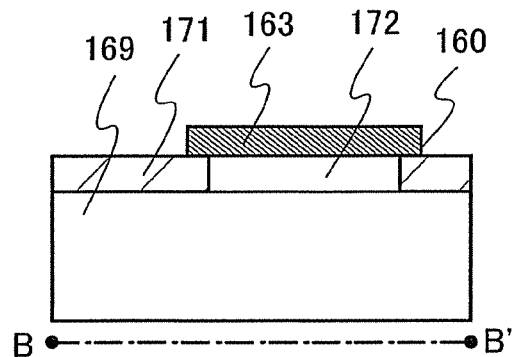

FIG. 4A shows an example of a top view of a transistor included in a semiconductor device of the present invention and FIGS. 4B and 4C each show an example of a cross-sectional view thereof. FIG. 4A is a top view of the transistor, FIG. 4B is a cross-sectional view taken along line A-A' in FIG. 4A, and FIG. 4C is a cross-sectional view taken along line B-B' in FIG. 4A.

The transistor shown in FIGS. 4A to 4C includes a semiconductor film 160 functioning as an active layer, an electrode 161, a portion of which overlapping with the semiconductor film 160 functions as a gate, and a gate insulating film 162 provided between the semiconductor film 120 and the electrode 161. The semiconductor film 160 includes impurity regions 163 and 164, one of which functions as a source and the other as a drain, a channel formation region 165, and LDD (lightly doped drain) regions 166 and 167 provided respectively between the impurity region 163 and the channel formation region 165 and between the impurity region 164 and the channel formation region 165.

An insulating film 171 is formed between the semiconductor film 160 and a base substrate 169. One cavity 172 is formed between the semiconductor film 160 and the base substrate 169 with an opening included in the insulating film 171. The cavity 172 overlaps with the impurity regions 163 and 164 and the channel formation region 165. In the case where the cavity 172 overlaps with the impurity regions 163 and 164 and the channel formation region 165, not only can self-heating be suppressed but also junction capacitance of the transistor can be further reduced. Note that the cavity 172 may completely fit inside the region overlapping with the semiconductor film 160 as shown in FIGS. 4A to 4C, or may be extended to the outside of the region overlapping with the semiconductor film 160. In the latter case, the cavity 172 has an opening outside the region overlapping with the semiconductor film 160. In the case where the cavity 172 has the opening, there is no difference in atmospheric pressure between the inside and outside the cavity 172. Thus, even if temperature of heat treatment is changed rapidly, the semiconductor film 160 can be prevented from being transformed.

Note that, although the semiconductor film 160 of the transistor shown in FIGS. 4A to 4C includes the LDD regions 166 and the LDD region 167, the present invention is not limited to this structure. The LDD regions 166 and the LDD region 167 are not necessarily provided, or either one of the LDD region 166 or the LDD region 167 may be provided. In addition, although in the transistor shown in FIGS. 4A to 4C, the LDD regions 166 and 167 are provided in regions other than the region overlapping with the electrode 161 in the semiconductor film 160, the present invention is not limited to this structure. The LDD regions 166 and 167 may be provided in regions overlapping with the electrode 161. Alternatively, the LDD regions 166 and 167 may be provided so as to extend to the region overlapping with the electrode 161 and a region other than the aforementioned region.

In addition, although a sidewall 168 which is used as a mask when the LDD regions 166 and 167 are formed is provided on sides of the electrode 161 in the transistor shown in FIGS. 4A and 4B, the present invention is not limited to this structure.

Figure 5A:
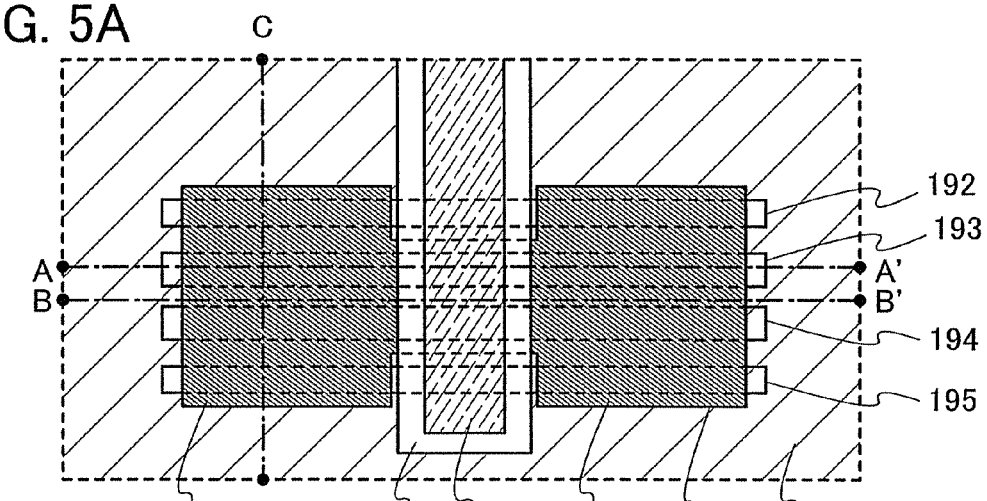
FIG. 5A is a top view showing a structure of a transistor included in a semiconductor device of the present invention and FIGS. 5B to 5D are cross-sectional views showing the same.
Figure 5B:
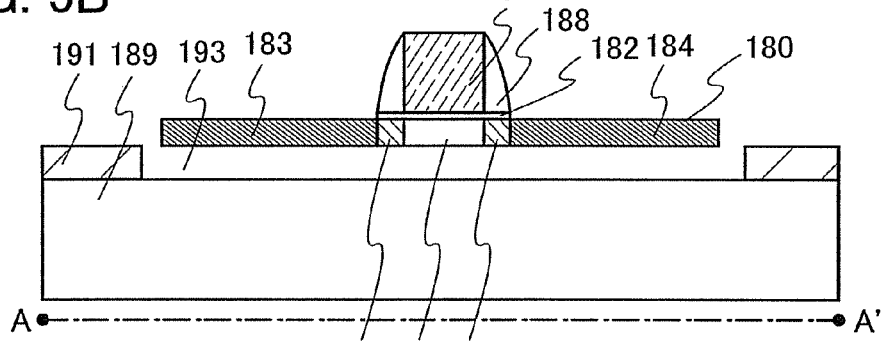
Figure 5C:
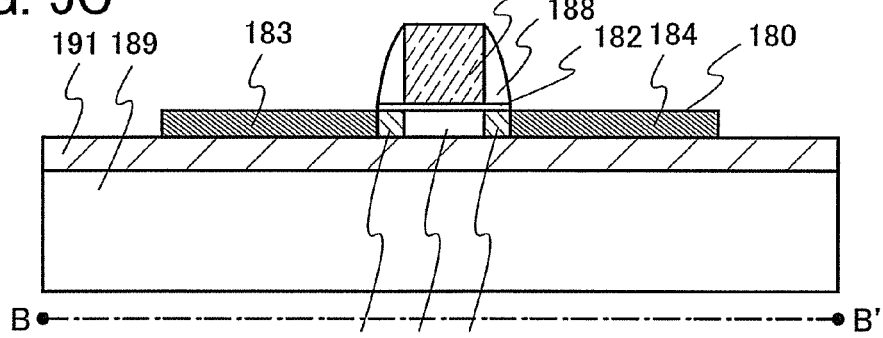
Figure 5D:
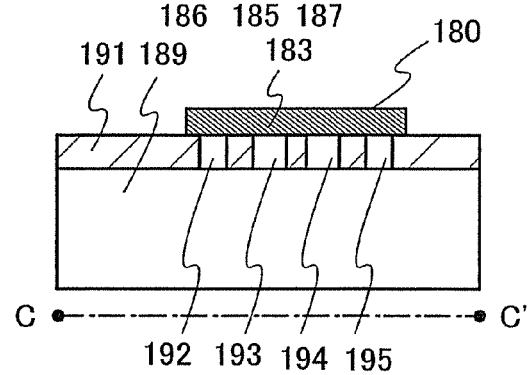

FIG. 5A shows an example of a top view of a transistor included in a semiconductor device of the present invention, and FIGS. 5B to 5D each show an example of a cross-sectional view thereof. FIG. 5A is a top view of the transistor, FIG. 5B is a cross-sectional view taken along line A-A' in FIG. 5A, FIG. 5C is a cross-sectional view taken along line B-B' in FIG. 5A, and FIG. 5D is a cross-sectional view taken along line C-C' in FIG. 5A.

The transistor shown in FIGS. 5A to 5D includes a semiconductor film 180 functioning as an active layer, an electrode 181, a portion of which overlapping with the semiconductor film 180 functions as a gate, and a gate insulating film 182 provided between the semiconductor film 180 and the electrode 181. The semiconductor film 180 includes impurity regions 183 and 184, one of which functions as a source and the other as a drain, a channel formation region 185, and LDD (lightly doped drain) regions 186 and 187 provided respectively between the impurity region 183 and the channel formation region 185 and between the impurity region 184 and the channel formation region 185.

An insulating film 191 is formed between the semiconductor film 180 and a base substrate 189. A plurality of cavities 192 to 195 is provided by openings included in the insulating film 191, between the semiconductor film 180 and the base substrate 189. The cavities 192 to 195 overlap with the impurity regions 183 and 184 and the channel formation region 185. The cavities 192 to 195 overlap with the impurity regions 183 and 184 and the channel formation region 185, whereby not only can self-heating be suppressed but also junction capacitance of the transistor can be further reduced.

Note that the cavities 192 to 195 may completely fit inside a region overlapping with the semiconductor film 180, or may be extended to the outside of the region overlapping with the semiconductor film 180 as shown in FIGS. 5A and 5B. In the latter case, the cavities 192 to 195 have openings outside the region overlapping with the semiconductor film 180. In the case where the cavities 192 to 195 have the openings, there is no difference in atmospheric pressure between the inside and outside the cavities 192 to 195. Thus, even if temperature of heat treatment is changed rapidly, the semiconductor film 180 can be prevented from being transformed.

Note that, although the semiconductor film 180 of the transistor shown in FIGS. 5A to 5D includes the LDD regions 186 and 187, the present invention is not limited to this structure. The LDD regions 186 and 187 are not necessarily provided, or either one of the LDD region 186 or the LDD region 187 may be provided. In addition, although in the transistor shown in FIGS. 5A to 5D, the LDD regions 186 and 187 are provided in regions other than the region overlapping with the electrode 121 in the semiconductor film 180, the present invention is not limited to this structure. The LDD regions 186 and 187 may be provided in regions overlapping with the electrode 181. Alternatively, the LDD regions 186 and 187 may be provided so as to extend to the region overlapping with the electrode 181 and a region other than the aforementioned region.

In addition, although a sidewall 188 which is used as a mask when the LDD regions 186 and 187 are formed is provided on sides of the electrode 181 in the transistor shown in FIGS. 5A and 5B, the present invention is not limited to this structure.

Note that in the case where one cavity is provided under the semiconductor film as shown in FIGS. 4A to 4C, the cavity can be formed so as to have a larger area under the semiconductor film, and thus junction capacitance and parasitic capacitance can be reduced more and self-heating can be suppressed more in the case where a plurality of cavities is provided. Alternatively, in the case where a plurality of cavities is provided under the semiconductor film as shown in FIGS. 5A to 5D, a transistor with higher physical strength than a transistor in the case where one cavity is provided can be formed.

In addition, although only one cavity is provided so as to overlap with the channel formation region in the case of the transistor shown in FIGS. 2A to 2C, the present invention is not limited to this structure. A plurality of cavities may be provided so as to overlap with the channel formation region. In the case where one cavity is provided, the cavity can be formed so as to have a larger area under the channel formation region, and thus self-heating can be suppressed more than in the case where a plurality of cavities is provided under the channel formation region. Alternatively, in the case where a plurality of cavities is provided under the channel formation region, a transistor with higher physical strength than a transistor in the case where one cavity is provided can be formed.

In addition, although two cavities which overlap with respective impurity regions are provided in the case of the transistor shown in FIGS. 3A to 3C, the present invention is not limited to this structure. A plurality of cavities which overlap with one impurity region may be provided. In the case where one cavity which overlaps with one impurity region is provided, the cavity can be formed so as to have a larger area under the impurity region, and thus self-heating can be suppressed more than in the case where a plurality of cavities is provided. Alternatively, in the case where a plurality of cavities is provided under one impurity region, a transistor with higher physical strength than a transistor in the case where one cavity is provided can be formed.

This embodiment mode can be implemented in combination with the above-described embodiment mode as appropriate.

Embodiment Mode 3

In this embodiment mode, a manufacturing method of a semiconductor device of the present invention, in which a semiconductor film is transferred from a semiconductor substrate (a bond substrate) to a supporting substrate (a base substrate) over which an insulating film including an opening is formed will be described.

Figure 6A:
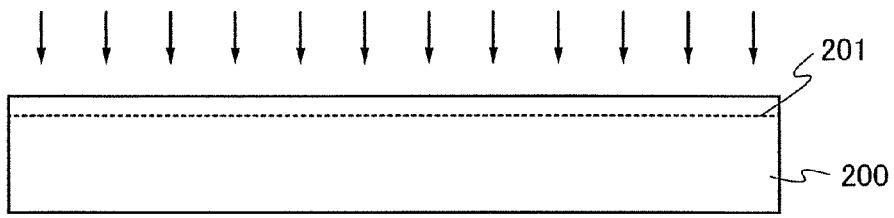
FIGS. 6A to 6D are views showing a manufacturing method of a semiconductor device of the present invention.

First, as shown in FIG. 6A, hydrogen or a noble gas, or hydrogen ions or noble gas ions is introduced into the bond substrate 200 as indicated by arrows, whereby a defect layer 201 having very small voids is formed in a region at a certain depth from a surface of the bond substrate 200. The position where the defect layer 201 is formed is determined depending on acceleration voltage at the time of the above-described introduction. The thickness of a semiconductor film 205 which is transferred from the bond substrate 200 to a base substrate is determined by the position of the defect layer 201; therefore, acceleration of the voltage at the time of the introduction is performed in consideration of the thickness of the semiconductor film. The semiconductor film 205 is formed to a thickness of 10 to 200 nm, preferably 10 to 50 nm. For example, in the case where hydrogen is introduced into the bond substrate 200, the dose is desirably $1\times10^{16}$ to $1\times10^{17}$/cm$^2$.

Figure 6B:
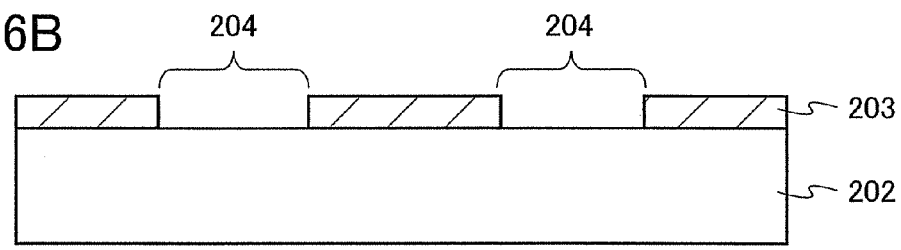

Next, as shown in FIG. 6B, an insulating film 203 formed over a base substrate 202 is processed (patterned) into a desired shape, whereby the insulating film 203 is partially removed to form openings 204 are formed. The base substrate 202 may be exposed in the openings 204, or may be covered with the insulating film 203 in the openings 204. Specifically, patterning can be performed in such a manner that the insulating film 203 is etched using a resist mask. The openings 204 correspond to cavities which are to be formed later between a semiconductor film of a transistor and the base substrate 202. Therefore, the openings 204 are formed in consideration of a layout of the semiconductor film of the transistor.

The insulating film 203 is formed using an insulating material such as silicon oxide, silicon nitride oxide, or silicon nitride. For example, in the case of using silicon oxide for the insulating film 203, the insulating film 203 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, a surface of the insulating film 203 may be densified with oxygen plasma treatment.

Alternatively, the insulating film 203 may be formed using silicon oxide which is formed with the use of an organic silane gas by a chemical vapor deposition method. As the silane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethyaminosilane ($SiH(N(CH_3)_2)_3$).

The insulating film 203 may be a single-layer insulating film or a layer in which a plurality of insulating films is stacked. For example, in this embodiment mode, the insulating film 203 is used in which, from the base substrate 202 side, silicon oxynitride in which the amount of oxygen is higher than that of nitrogen, silicon nitride oxide in which the amount of nitrogen is higher than that of oxygen, and silicon oxide formed using an organic silane gas by a chemical vapor deposition method are stacked.

In the case of using silicon nitride for the insulating film 203, the insulating film 203 can be formed using a mixed gas of silane and ammonium by a vapor deposition method such as plasma CVD. In addition, in the case of using silicon nitride oxide for the insulating film 203, the insulating film 203 can be formed using a mixed gas of silane and ammonium or a mixed gas of silane and nitrogen oxide by a vapor deposition method such as plasma CVD.

Note that hydrogenation treatment may be performed on the bond substrate 200 before the bond substrate 200 and the base substrate 202 are bonded to each other. For example, the hydrogenation treatment is performed at 350° C. for about two hours in a hydrogen atmosphere.

Figure 6C:
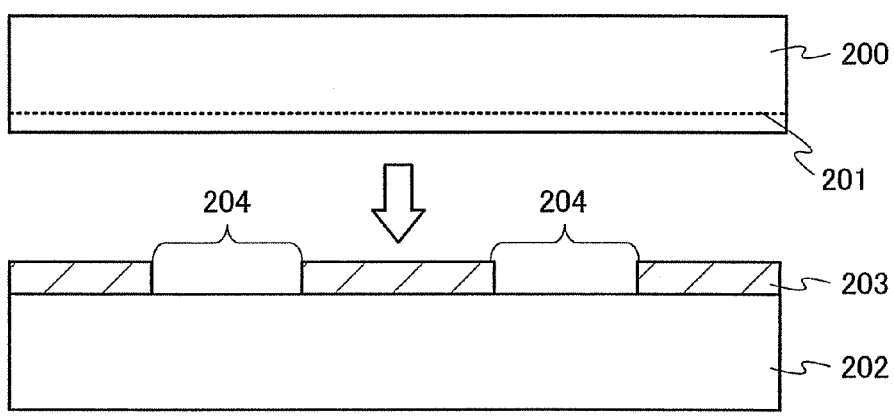

After the mask is removed, as shown in FIG. 6C, the bond substrate 200 and the base substrate 202 are bonded to each other with the insulating film 203 interposed therebetween. The bond substrate 200 and the base substrate 202 are bonded to each other so that the openings 204 face the bond substrate 200. The insulating film 203 and the bond substrate 200 are bonded to each other at a region of the insulating film 203 other than the openings 204, whereby the bond substrate 200 and the base substrate 202 can be bonded to each other.

The bonding is formed by van der Waals forces, and a strong bond is formed at room temperature. Note that since the above-described bonding can be performed at a low temperature, various substrates can be used as the base substrate 202. As the base substrate 202, for example, a substrate such as a quartz substrate or a sapphire substrate can be used as well as a glass substrate made of aluminosilicate glass, barium borosilicate glass, aluminoborosilicate glass or the like. Furthermore, as the base substrate 202, a semiconductor substrate formed of silicon, gallium arsenide, indium phosphide, or the like can be used.

Note that in the case of using a semiconductor substrate as the base substrate 202, the insulating film 203 can be formed by thermal oxidation of the base substrate 202.

As the bond substrate 200, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 200. In addition, as the bond substrate 200, a semiconductor substrate formed of silicon having lattice distortion, silicon germanium in which germanium is added to silicon, or the like may also be used. Silicon having lattice distortion can be formed by formation of silicon on silicon germanium or silicon nitride which has larger lattice constant than silicon.

Note that heat treatment or pressure treatment may be performed after the base substrate 202 and the bond substrate 200 are bonded to each other. The bond strength can be increased with heat treatment or pressure treatment.

Figure 6D:
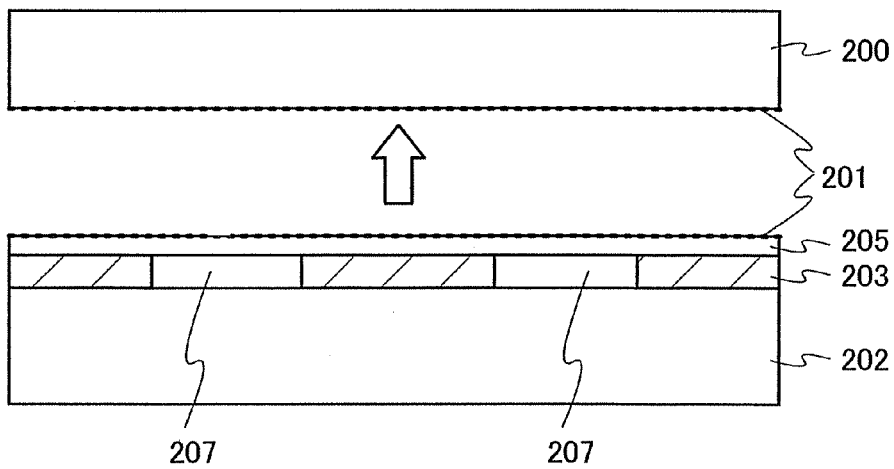

Heat treatment is performed after the bond substrate 200 and the base substrate 202 are bonded to each other, whereby the adjacent very small voids in the defect layer 201 are connected and the volume of the void is increased. As a result, as shown in FIG. 6D, the bond substrate 200 is split along the defect layer 201, and the semiconductor film 205 which is part of the bond substrate 200 is separated from the bond substrate 200. The heat treatment is preferably performed at a temperature that is equal to or lower than the allowable temperature limit of the bond substrate 200. For example, heat treatment may be performed at a temperature ranging from 400 to 600° C. After the separation, the semiconductor film 205 is transferred to the base substrate 202. After that, heat treatment at a temperature ranging from 400 to 600° C. is preferably performed in order to further make the bond between the insulating film 203 and the semiconductor film 205 stronger.

Crystal plane orientation of the semiconductor film 205 can be controlled by plane orientation of the bond substrate 200. The bond substrate 200 having crystal plane orientation which is suitable for a semiconductor element which is to be formed may be selected as appropriate. The mobility of the transistor depends on the crystal plane orientation of the semiconductor film 205. When a transistor with higher mobility is desired to be obtained, the direction of bonding of the bond substrate 200 is set in consideration of the direction of a channel and the crystal plane orientation.

A pair of cavities 207 formed with the openings 204 is provided between the semiconductor film 205 and the base substrate 202.

Figure 7A:
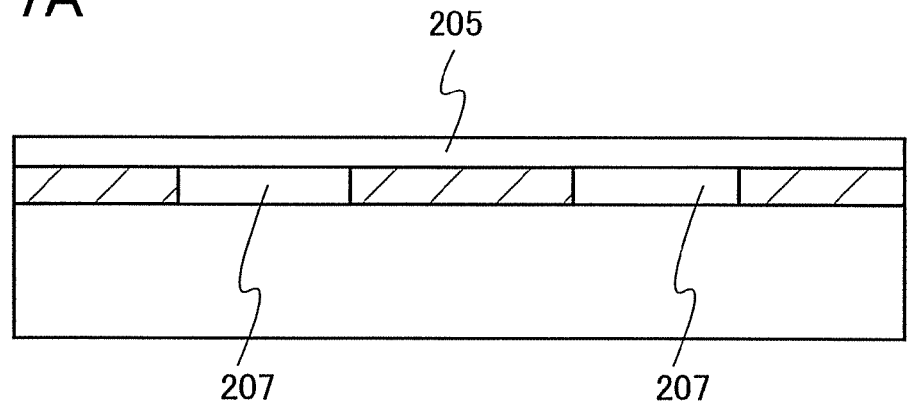
FIGS. 7A to 7C are views showing a manufacturing method of a semiconductor device of the present invention.

Next, as shown in FIG. 7A, a surface of the transferred semiconductor film 205 is planarized. Although the planarization is not necessarily essential, the planarization makes it possible to improve characteristics of the interface between the semiconductor film 205 and a gate insulating film in the transistor which is to be formed later. Specifically, the planarization can be performed by chemical mechanical polishing (CMP), liquid jet polishing, or the like. The thickness of the semiconductor film 205 is reduced by the above-described planarization. It is desirable that the thickness of the semiconductor film 205 after the planarization be 5 to 25 nm.

Note that, although the case where a Smart Cut (registered trademark) method is used in which the semiconductor film 205 is separated from the bond substrate 200 using the defect layer 201 is used is described in this embodiment mode, the semiconductor film 205 may be bonded to the base substrate 202 by another bonding method such as ELTRAN (epitaxial layer transfer), a dielectric isolation method, or a PACE (plasma assisted chemical etching) method.

Figure 7B:
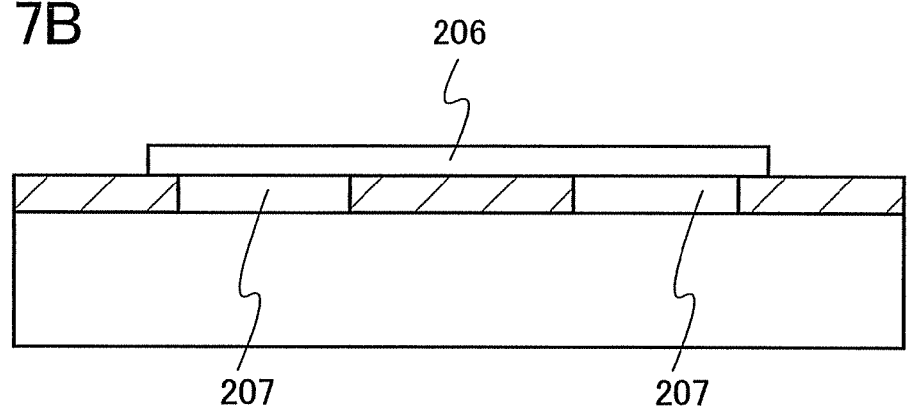

Next, as shown in FIG. 7B, the semiconductor film 205 is patterned, whereby an island-shaped semiconductor film 206 is formed. The pair of cavities 207 formed with the openings 204 remains between the island-shaped semiconductor film 206 and the base substrate 202 even after the patterning of the semiconductor film 205.

Figure 7C:
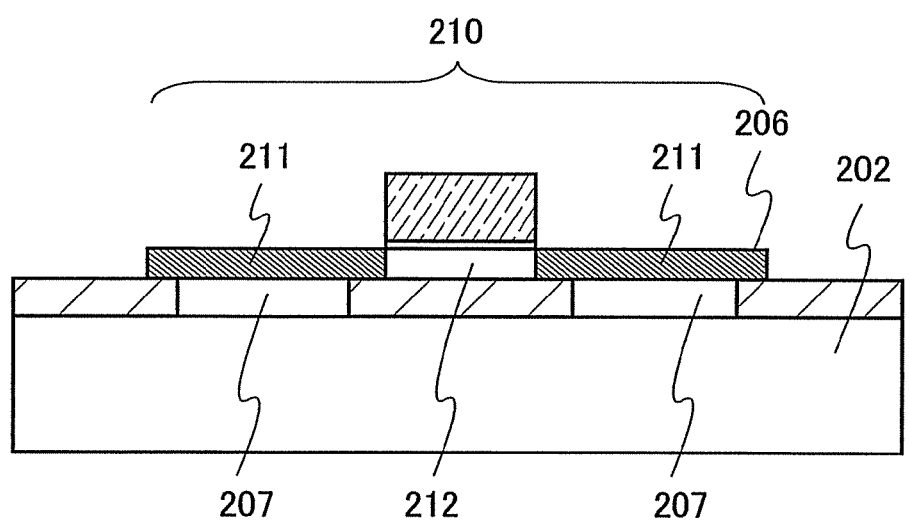

The present invention makes it possible to form various semiconductor elements such as transistors with the use of the semiconductor film 206 which is formed through the above-described steps. A transistor 210 formed using the semiconductor film 206 is shown in FIG. 7C as an example.

In the manufacturing method of the present invention, the openings 204 are formed by etching; thus, the cavities 207 with a desired depth and a desired shape can be formed precisely through a simple procedure.

In addition, in the manufactured transistor 210, the cavities 207 are included between the semiconductor film 206 and the base substrate 202, and the cavities 207 are in contact with the semiconductor film 206. Thus, when the cavities 207 are filled with air, nitrogen, an inert gas, or the like that has lower relative permittivity than an inorganic insulating film of silicon oxide or the like, parasitic capacitance or junction capacitance of the transistor 210 can be reduced. It is desirable that the percentage of moisture contained in the above-described gas be decreased in order to suppress volume expansion with temperature change. Note that, in fact, a natural oxide film is formed, in some cases, in a portion of the semiconductor film 206, which is in contact with the cavities 207. However, the insulating film described in Patent Document 2 is supposed to have a thickness of several μm to several hundreds μm, and the natural oxide film is about several nm thick, which is remarkably thinner than the insulating film. Thus, it can be said that parasitic capacitance or junction capacitance of the transistor 210 can be reduced more in the present invention than in the case where the insulating film is formed to the above-described thickness in the portion of the semiconductor film 206, which is in contact with the cavities.

Note that, although the case where the cavities 207 are filled with gas is described in this embodiment mode, the present invention is not limited to this structure. For example, the cavities 207 may be filled with a material that has lower relative permittivity than an inorganic insulating film of silicon oxide or the like, for example, a porous insulating film (a porous material) including a large number of pores therein.

In addition, although the structure in which two cavities 207 are provided between the island-shaped semiconductor film 206 and the base substrate 202 is described in this embodiment, the present invention is not limited to this structure. One cavity 207 may be provided, or three or more cavities 207 may be provided. Moreover, although in this embodiment mode, the cavities 207 are formed so as to overlap with impurity regions 211, one of which functions as a source and the other as a drain, the present invention is not limited to this structure. The cavity 207 may be formed so as to overlap with a channel formation region 212 in the semiconductor film 206, or the cavity 207 may be formed so as to overlap with a pair of the impurity regions 211 and the channel formation region 212.

Note that, junction capacitance can be reduced more in the case of forming the cavity 207 overlaps with at least the impurity regions 211 than in the case of forming the cavity 207 which overlaps with only the channel formation region 212. Alternatively, self-heating can be suppressed more in the case where the cavity 207 which overlaps with at least the channel formation region 212 is formed than in the case where the cavity 207 which overlaps with only the impurity regions 211 is formed.

This embodiment mode can be implemented in combination with the above-described embodiment mode as appropriate.

Embodiment Mode 4

In this embodiment mode, a manufacturing method of a semiconductor device of the present invention will be described, in which a semiconductor substrate (a bond substrate) provided with an insulating film including an opening and a supporting substrate (a base substrate) are bonded to each other, whereby a semiconductor film is transferred to the base substrate.

Figure 8A:
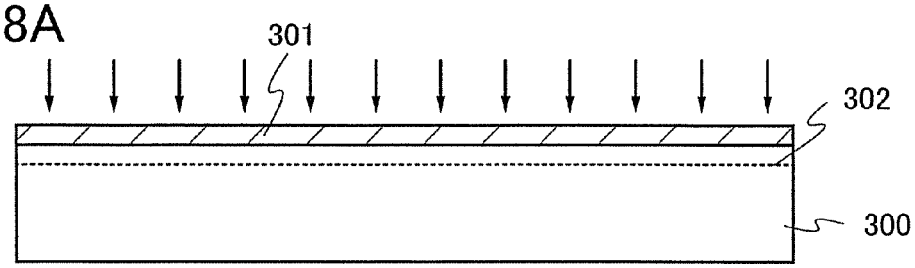
FIGS. 8A to 8D are views showing a manufacturing method of a semiconductor device of the present invention.

First, as shown in FIG. 8A, a bond substrate 300 on which an insulating film 301 is formed is prepared. The insulating film 301 is formed using an insulating material such as silicon oxide, silicon nitride oxide, or silicon nitride. Since the thickness of the insulating film 301 influences the depth of a defect layer 302 which is to be formed later, the thickness of the insulating film 301 is desirably uniform. For example, in the case of using silicon oxide for the insulating film 301, the insulating film 301 is desirably formed by thermal oxidation of the bond substrate 300. For example, the insulating film 301 is preferably formed by heat treatment at 900 to 1100° C. in a water vapor atmosphere. Alternatively, the insulating film 301 may be formed by oxidation of the bond substrate 300 with oxygen plasma treatment. In addition, in the case of using silicon oxide for the insulating film 301, the insulating film 301 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, a surface of the insulating film 301 may be densified with oxygen plasma treatment.

Alternatively, the insulating film 301 may be formed using silicon oxide which is formed with the use of an organic silane gas by a chemical vapor deposition method. As the silane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethyaminosilane ($SiH(N(CH_3)_2)_3$).

The insulating film 301 may be a single-layer insulating film or a layer in which a plurality of insulating films is stacked. For example, in this embodiment mode, the insulating film 301 is used in which, from the bond substrate 300 side, silicon oxynitride in which the amount of oxygen is higher than that of nitrogen, silicon nitride oxide in which the amount of nitrogen is higher than that of oxygen, and silicon oxide formed using an organic silane gas by a chemical vapor deposition method are stacked.

In the case of using silicon nitride for the insulating film 301, the insulating film 301 can be formed using a mixed gas of silane and ammonium by a vapor deposition method such as plasma CVD. In addition, in the case of using silicon nitride oxide for the insulating film 301, the insulating film 301 can be formed using a mixed gas of silane and ammonium or a mixed gas of silane and nitrogen oxide by a vapor deposition method such as plasma CVD.

Note that, in some cases, in a step of removing the semiconductor film 305 from the bond substrate 300, hydrogen or a noble gas, or hydrogen ions or noble gas ions is introduced into the bond substrate 300 at high concentration, and accordingly a surface of the bond substrate 300 becomes rough and sufficient bond strength for bonding with the base substrate cannot be obtained. The insulating film 301 is provided, whereby the surface of the bond substrate 300 is protected at the time of the introduction of hydrogen or a noble gas, or hydrogen ions or noble gas ions, and the base substrate and the bond substrate 300 can be bonded to each other well.

Next, hydrogen or a noble gas, or hydrogen ions or noble gas ions is introduced into the bond substrate 300 as indicated by arrows, whereby the defect layer 302 having very small voids is formed in a region at a certain depth from a surface of the bond substrate 300. The position where the defect layer 302 is formed is determined depending on acceleration voltage at the time of the above-described introduction. The thickness of a semiconductor film 305 which is transferred from the bond substrate 300 to the base substrate is determined by the position of the defect layer 302; therefore, acceleration of the voltage at the time of the introduction is performed in consideration of the thickness of the semiconductor film. The semiconductor film 305 is formed to a thickness of 10 to 200 nm, preferably 10 to 50 nm. For example, in the case where hydrogen is introduced into the bond substrate 300, the dose is desirably $1 \times 10^{16}$ to $1 \times 10^{17}/cm^2$.

Note that, although the defect layer 302 is formed in the bond substrate 300 after the insulating film 301 is formed over the bond substrate 300 in this embodiment mode, the present invention is not limited to this structure. The defect layer 302 may be formed in the bond substrate 300 before the insulating film 301 is formed. Alternatively, in the case of using a plurality of insulating films as the insulating film 301, some of the plurality of insulating films may be formed over the bond substrate 300 first, the defect layer 302 may be formed in the bond substrate 300, and then the other insulating films may be formed over the bond substrate 300. In this case, for example, a stacked layer of a silicon nitride oxide film and a silicon oxynitride film is preferably used as the insulating film 301. Then, it is preferable that the silicon nitride oxide film be formed over the bond substrate 300 first, the defect layer 302 be formed in the bond substrate 300, and then the silicon oxide film be formed using an organic silane gas by a chemical vapor deposition method.

Figure 8B:
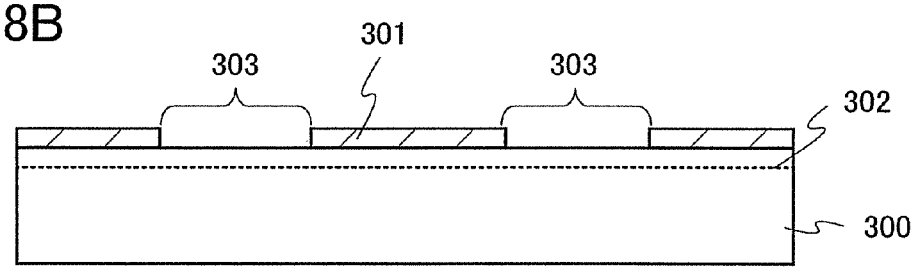

Next, as shown in FIG. 8B, an insulating film 301 formed over the bond substrate 300 is processed (patterned) into a desired shape, whereby the insulating film 301 is partially removed to form openings 303. The bond substrate 300 may be exposed in the openings 303, or may be covered with the insulating film 301 in the openings 303. Specifically, patterning can be performed in such a manner that the insulating film 301 is etched using a resist mask. The openings 303 correspond to cavities which are to be formed between a semiconductor film of a transistor and a base substrate 304. Therefore, the openings 303 are formed in consideration of a layout of the semiconductor film of the transistor.

Note that hydrogenation treatment may be performed on the bond substrate 300 before the bond substrate 300 and the base substrate 304 are bonded to each other. For example, the hydrogenation treatment is performed at 350° C. for about two hours in a hydrogen atmosphere.

Figure 8C:
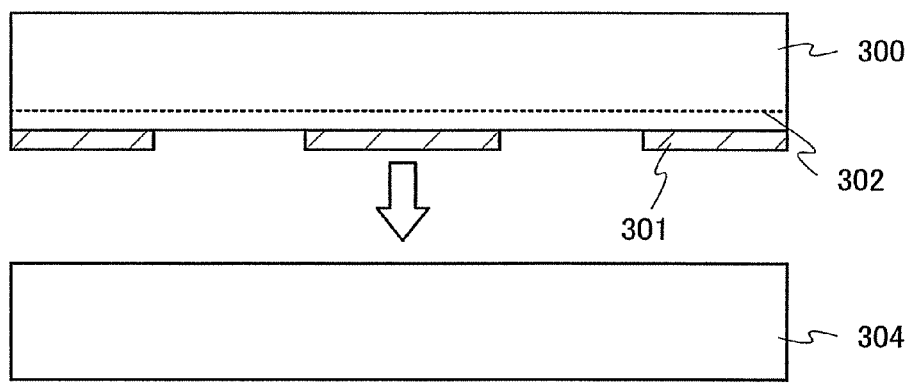

After the mask is removed, as shown in FIG. 8C, the bond substrate 300 and the base substrate 304 are bonded to each other with the insulating film 301 interposed therebetween. The bond substrate 300 and the base substrate 304 are bonded to each other so that the openings 303 face the base substrate 304. The insulating film 301 and the base substrate 304 are bonded to each other at a region of the insulating film 301 other than the openings 303, whereby the bond substrate 300 and the base substrate 304 can be bonded to each other.

The bonding is formed by van der Waals forces, and a strong bond is formed at room temperature. Note that since the above-described bonding can be performed at a low temperature, various substrates can be used as the base substrate 304. As the base substrate 304, for example, a substrate such as a quartz substrate or a sapphire substrate can be used as well as a glass substrate made of aluminosilicate glass, barium borosilicate glass, aluminoborosilicate glass or the like. Furthermore, as the base substrate 304, a semiconductor substrate formed of silicon, gallium arsenide, indium phosphide, or the like can be used.

As the bond substrate 300, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 300. In addition, as the bond substrate 300, a semiconductor substrate formed of silicon having lattice distortion, silicon germanium in which germanium is added to silicon, or the like may also be used. Silicon having lattice distortion can be formed by formation of silicon on silicon germanium or silicon nitride which has larger lattice constant than silicon.

Note that heat treatment or pressure treatment may be performed after the base substrate 304 and the bond substrate 300 are bonded to each other. The bond strength can be increased with heat treatment or pressure treatment.

Figure 8D:
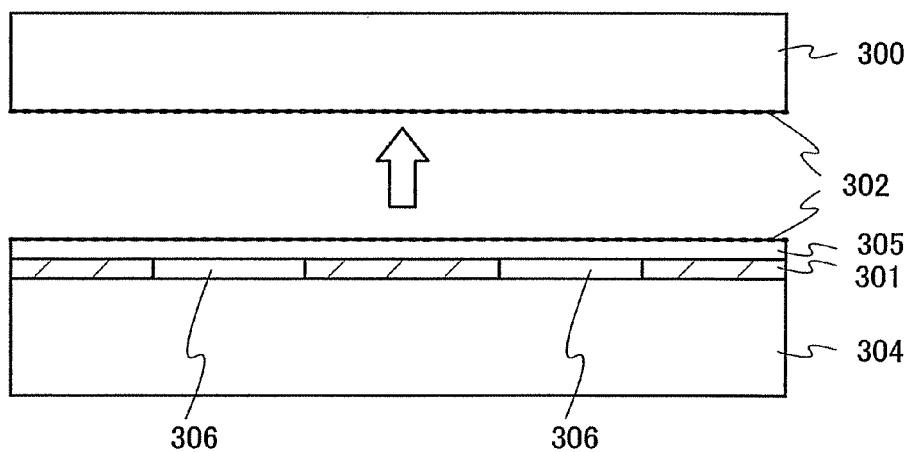

Heat treatment is performed after the bond substrate 300 and the base substrate 304 are bonded to each other, whereby the adjacent very small voids in the defect layer 302 are connected and the volume of the void is increased. As a result, as shown in FIG. 8D, the bond substrate 300 is slit along the defect layer 302 and the insulating film 301 and the semiconductor film 305 which is part of the bond substrate 300 are separated from the bond substrate 300. The heat treatment is preferably performed at a temperature that is equal to or lower than the allowable temperature limit of the bond substrate 300. For example, heat treatment may be performed at a temperature ranging from 400 to 600° C. After the separation, the semiconductor film 305 and the insulating film 301 are transferred to the base substrate 304. After that, heat treatment at a temperature ranging from 400 to 600° C. is preferably performed in order to further make the bond between the insulating film 301 and the base substrate 304 stronger.

Crystal plane orientation of the semiconductor film 305 can be controlled by orientation of crystal planes of the bond substrate 300. The bond substrate 300 having crystal plane orientation which is suitable for a semiconductor element which is to be formed may be selected as appropriate. The mobility of the transistor depends on the crystal plane orientation of the semiconductor film 305. When a transistor with higher mobility is desired to be obtained, the direction of bonding of the bond substrate 300 is set in consideration of the direction of a channel and the crystal plane orientation.

Cavities 306 formed with the openings 303 are provided between the semiconductor film 305 and the base substrate 304.

After the step shown in FIG. 8D, in a similar manner to Embodiment Mode 3, a surface of the transferred semiconductor film 305 is planarized and patterning is performed, whereby an island-shaped semiconductor film is formed. The cavities 306 formed with the openings 304 remain between the island-shaped semiconductor film and the base substrate 304 even after the patterning of the semiconductor film 305.

The present invention makes it possible to form various semiconductor elements such as transistors with the use of the island-shaped semiconductor film which is formed through the above-described steps.

In the manufacturing method of the present invention, the openings 303 are formed by etching; thus, cavities 306 with a desired depth and shape can be formed precisely through a simple procedure.

Note that, although the case where that a Smart Cut (registered trademark) method is used in which the semiconductor film 305 is separated from the bond substrate 300 using the defect layer 302 is described in this embodiment mode, the semiconductor film 305 may be bonded to the base substrate 304 by another bonding method such as ELTRAN (epitaxial layer transfer), a dielectric isolation method, or a PACE (plasma assisted chemical etching) method.

In addition, in the transistor manufactured using the island-shaped semiconductor film, the cavities 306 are included between the island-shaped semiconductor film and the base substrate 304, and the cavities 306 are in contact with the semiconductor film 305. Thus, the cavities 306 are filled with air, nitrogen, an inert gas, or the like that has lower relative permittivity than an inorganic insulating film of silicon oxide or the like, whereby parasitic capacitance or junction capacitance of the transistor can be reduced. It is desirable that the percentage of moisture contained in the above-described gas be decreased in order to suppress volume expansion with temperature change.

Note that, in fact, a natural oxide film is formed, in some cases, in a portion of the island-shaped semiconductor film, which is in contact with the cavities 306. However, the insulating film described in Patent Document 2 is supposed to have a thickness of several μm to several hundreds μm, and the natural oxide film is about several nm thick, which is remarkably thinner than the insulating film. Thus, it can be said that parasitic capacitance or junction capacitance of the transistor can be reduced more or self-heating can be suppressed more in the present invention than in the case where the insulating film is formed to the above-described thickness in the portion of the island-shaped semiconductor film, which is in contact with the cavities.

Note that, although the case where the cavities 306 are filled with gas is described in this embodiment mode, the present invention is not limited to this structure. For example, the cavities 306 may be filled with a material that has lower relative permittivity than an inorganic insulating film of silicon oxide or the like, for example, a porous insulating film (a porous material) including a large number of pores therein.

Note that, in this embodiment mode, the insulating film 301 is formed first so as to be in contact with the semiconductor film 305, and then the insulating film 301 and the base substrate 304 are bonded to each other. Thus, interface state density at the interface between the semiconductor film 305 and the insulating film 301 in this case can be more uniform than in the case where the semiconductor film 305 and the insulating film 301 are bonded to each other. Therefore, variation in characteristics such as threshold voltage of the transistor using the island-shaped semiconductor film formed by patterning of the semiconductor film 305 can be further suppressed.

This embodiment mode can be implemented in combination with the above-described embodiment mode as appropriate.

Embodiment Mode 5

In this embodiment mode, a manufacturing method of a semiconductor device of the present invention will be described, in which a semiconductor substrate (a bond substrate) over which an insulating film including openings is formed and a supporting substrate (a base substrate) over which an insulating film including openings is formed are bonded to each other, whereby a semiconductor film is transferred to the base substrate.

Figure 9A:
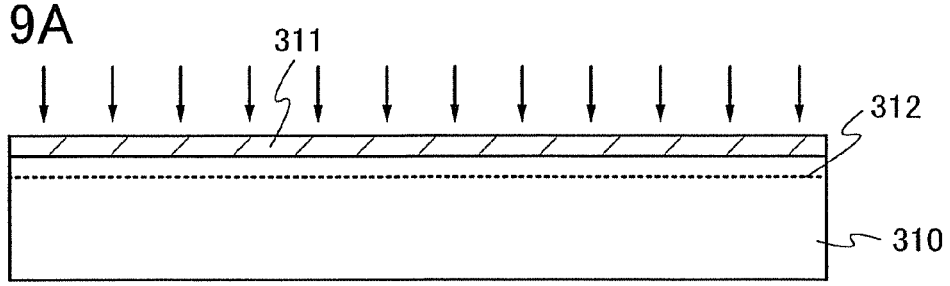
FIGS. 9A to 9D are views showing a manufacturing method of a semiconductor device of the present invention.

First, as shown in FIG. 9A, a bond substrate 310 on which an insulating film 311 is formed is prepared. The insulating film 311 is formed using an insulating material such as silicon oxide, silicon nitride oxide, or silicon nitride. Since the thickness of the insulating film 311 influences the depth of a defect layer 312 which is to be formed later, the thickness of the insulating film 311 is desirably uniform For example, in the case of using silicon oxide for the insulating film 311, the insulating film 311 is desirably formed by thermal oxidation of the bond substrate 310. For example, the insulating film 311 is preferably formed by heat treatment at 900 to 1100° C. in a water vapor atmosphere. Alternatively, the insulating film 311 may be formed by oxidation of the bond substrate 310 with oxygen plasma treatment. In addition, in the case of using silicon oxide for the insulating film 311, the insulating film 311 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, a surface of the insulating film 311 may be densified with oxygen plasma treatment.

Alternatively, the insulating film 311 may be formed using silicon oxide which is formed with the use of an organic silane gas by a chemical vapor deposition method. As the silane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethyaminosilane ($SiH(N(CH_3)_2)_3$).

The insulating film 311 may be a single-layer insulating film or a layer in which a plurality of insulating films is stacked. For example, in this embodiment mode, the insulating film 311 is used in which, from the bond substrate 310 side, silicon oxynitride in which the amount of oxygen is higher than that of nitrogen, silicon nitride oxide in which the amount of nitrogen is higher than that of oxygen, and silicon oxide formed using an organic silane gas by a chemical vapor deposition method are stacked.

In the case of using silicon nitride for the insulating film 311, the insulating film 311 can be formed using a mixed gas of silane and ammonium by a vapor deposition method such as plasma CVD. In addition, in the case of using silicon nitride oxide for the insulating film 311, the insulating film 311 can be formed using a mixed gas of silane and ammonium or a mixed gas of silane and nitrogen oxide by a vapor deposition method such as plasma CVD.

Note that, in some cases, in a step of removing a semiconductor film 317 from the bond substrate 310, hydrogen or a noble gas, or a hydrogen ion or a noble gas ion is introduced into the bond substrate 300 at high concentration, and accordingly a surface of the bond substrate 310 becomes rough and sufficient bond strength for bonding with the base substrate cannot be obtained. The insulating film 311 is provided, whereby the surface of the bond substrate 310 is protected at the time of the introduction of hydrogen or a noble gas, or hydrogen ions or noble gas ions, and the base substrate and the bond substrate 310 can be bonded to each other well.

Next, hydrogen or a noble gas, or hydrogen ions or noble gas ions is introduced into the bond substrate 310 as indicated by arrows, whereby the defect layer 312 having very small voids is formed in a region at a certain depth from the surface of the bond substrate 310. The position where the defect layer 312 is formed is determined depending on acceleration voltage at the time of the above-described introduction. The thickness of the semiconductor film 317 which is transferred from the bond substrate 310 to the base substrate is determined by the position of the defect layer 312; therefore, acceleration of the voltage at the time of the introduction is performed in consideration of the thickness of the semiconductor film. The semiconductor film 317 is formed to a thickness of 10 to 200 nm, preferably 10 to 50 nm. For example, in the case where hydrogen is introduced into the bond substrate 310, the dose is desirably $1 \times 10^{16}$ to $1 \times 10^{17}/cm^2$.

Note that, although the defect layer 312 is formed in the bond substrate 310 after the insulating film 311 is formed over the bond substrate 310 in this embodiment mode, the present invention is not limited to this structure. The defect layer 312 may be formed in the bond substrate 310 before the insulating film 311 is formed. Alternatively, in the case of using a plurality of insulating films as the insulating film 311, some of the plurality of insulating films may be formed over the bond substrate first, the defect layer 312 may be formed in the bond substrate 310, and then the other insulating films may be formed over the bond substrate 310. In this case, for example, a stacked layer of a silicon nitride oxide film and a silicon oxynitride film is preferably used as the insulating film 311. It is preferable that the silicon nitride oxide film be formed over the bond substrate 310 first, the defect layer 312 be formed in the bond substrate 310, and then the silicon oxide film be formed using an organic silane gas by a chemical vapor deposition method.

Figure 9B:
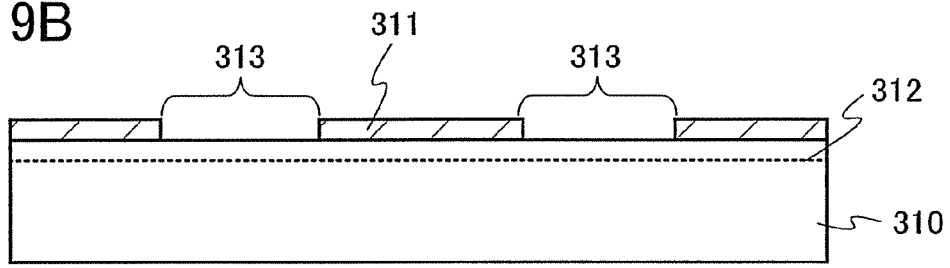

Next, as shown in FIG. 9B, the insulating film 311 formed over the base substrate 310 is processed (patterned) into a desired shape, whereby the insulating film 311 is partially removed to form openings 313. The bond substrate 310 may be exposed in the openings 313, or may be covered with the insulating film 311 in the openings 313. Specifically, patterning can be performed in such a manner that the insulating film 311 is etched using a resist mask. The openings 313 correspond to cavities which are to be formed later between a semiconductor film of a transistor and a base substrate 314. Therefore, the openings 313 are formed in consideration of a layout of the semiconductor film of the transistor.

Note that hydrogenation treatment may be performed on the bond substrate 310 before the bond substrate 310 and the base substrate 314 are bonded to each other. For example, the hydrogenation treatment is performed at 350° C. for about two hours in a hydrogen atmosphere.

Figure 9C:
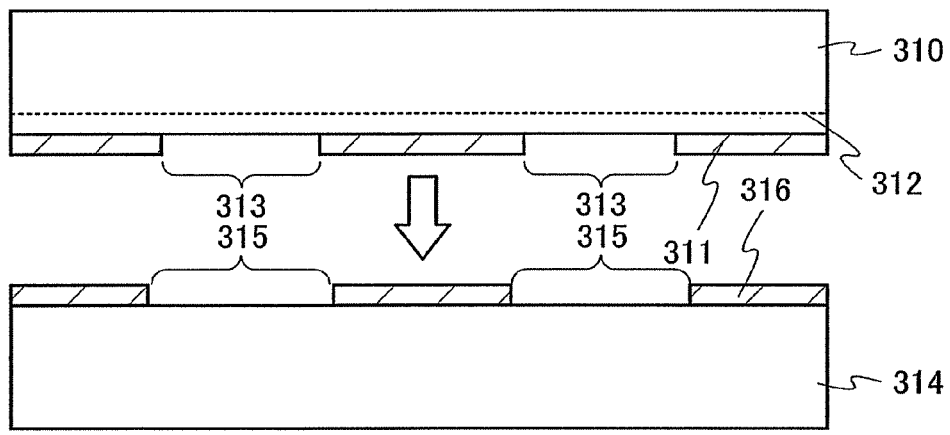

After the mask is removed, as shown in FIG. 9C, the bond substrate 310 and the base substrate 314 are bonded to each other. In this embodiment mode, the base substrate 314 provided with an insulating film 316 including openings 315 is prepared. The insulating film 316 can be formed of the above-described material which can be used for the insulating film 311. In addition, the openings 315 can be formed by etching or the like. The bond substrate 310 and the base substrate 314 are bonded to each other so that the insulating film 311 and the insulating film 316 are interposed between the bond substrate 310 and the base substrate 314 and at least parts of the openings 311 and 316 overlap with each other. The insulating films 311 and 316 are bonded to each other at regions other than the openings 313 and 315, whereby the bond substrate 310 and the base substrate 314 can be bonded to each other.

The bonding is formed by van der Waals forces, and a strong bond is formed at room temperature. Note that since the above-described bonding can be performed at a low temperature, various substrates can be used as the base substrate 314. As the base substrate 314, for example, a substrate such as a quartz substrate or a sapphire substrate can be used as well as a glass substrate made of aluminosilicate glass, barium borosilicate glass, aluminoborosilicate glass. Furthermore, as the base substrate 314, a semiconductor substrate formed of silicon, gallium arsenide, indium phosphide, or the like can be used.

Note that in the case of using a semiconductor substrate as the base substrate 314, the insulating film 316 can be formed by thermal oxidation of the base substrate 314.

As the bond substrate 310, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 310. In addition, as the bond substrate 310, a semiconductor substrate formed of silicon having lattice distortion, silicon germanium in which germanium is added to silicon, or the like may also be used. Silicon having lattice distortion can be formed by formation of silicon on silicon germanium or silicon nitride which has larger lattice constant than silicon.

Note that heat treatment or pressure treatment may be performed after the base substrate 314 and the bond substrate 310 are bonded to each other. The bond strength can be increased by heat treatment or pressure treatment.

Figure 9D:
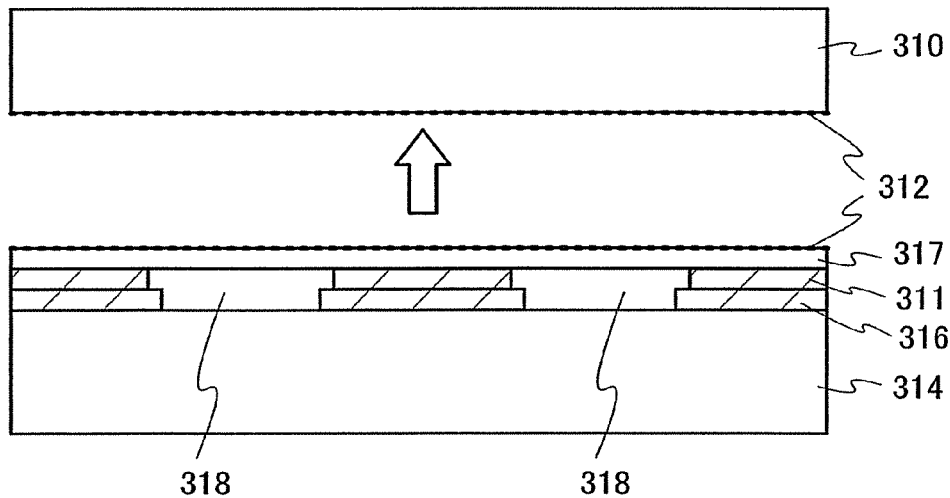

Heat treatment is performed after the bond substrate 310 and the base substrate 314 are bonded to each other, whereby the adjacent very small voids in the defect layer 312 are connected and the volume of the void is increased. As a result, as shown in FIG. 9D, the bond substrate 310 is slit along the defect layer 312, and the semiconductor film 317 and the insulating film 311 which are parts of the bond substrate 310 are separated from the bond substrate 310. The heat treatment is preferably performed at a temperature that is equal to or lower than the allowable temperature limit of the bond substrate 310. For example, heat treatment may be performed at a temperature ranging from 400 to 600° C. After the separation, the semiconductor film 317 and the insulating film 311 are transferred to the base substrate 314. After that, heat treatment at a temperature ranging from 400 to 600° C. is preferably performed in order to further make the bond between the insulating film 311 and the semiconductor film 316 stronger.

Crystal plane orientation of the semiconductor film 317 can be controlled by orientation of crystal planes of the bond substrate 310. The bond substrate 310 having crystal plane orientation which is suitable for a semiconductor element which is to be formed may be selected as appropriate. The mobility of the transistor depends on the crystal plane orientation of the semiconductor film 317. When a transistor with higher mobility is desired to be obtained, the direction of bonding of the bond substrate 310 is set in consideration of the direction of a channel and the crystal plane orientation.

Cavities 318 formed with the openings 313 and 315 are provided between the semiconductor film 317 and the base substrate 314.

After the step shown in FIG. 9D, in a similar manner to Embodiment Mode 3, a surface of the transferred semiconductor film 317 is planarized and patterning is performed, whereby an island-shaped semiconductor film is formed. The cavities 318 formed with the openings 313 and 315 remain between the island-shaped semiconductor film and the base substrate 304 even after the patterning of the semiconductor film 317.

The present invention makes it possible to form various semiconductor elements such as transistors with the use of the island-shaped semiconductor film which is formed through the above-described steps.

In the manufacturing method of the present invention, the openings 313 or 315 are formed by etching; thus, the cavities 318 with a desired depth and a desired shape can be formed precisely through a simple procedure.

Note that, although the case where a Smart Cut (registered trademark) method is used in which the semiconductor film 317 is separated from the bond substrate 310 using the defect layer 312 is described in this embodiment mode, the semiconductor film 317 may be bonded to the base substrate 314 by other bonding method such as ELTRAN (epitaxial layer transfer), a dielectric isolation method, or a PACE (plasma assisted chemical etching) method.

In addition, in the transistor manufactured using the island-shaped semiconductor film, the cavities 318 are included between the island-shaped semiconductor film and the base substrate 314, and the cavities 318 are in contact with the semiconductor film 317. Thus, the cavities 318 are filled with air, nitrogen, an inert gas, or the like that has lower relative permittivity than an inorganic insulating film of silicon oxide or the like, whereby parasitic capacitance or junction capacitance of the transistor can be reduced. It is desirable that the percentage of moisture contained in the above-described gas be decreased in order to suppress volume expansion with temperature change.

Note that, in fact, a natural oxide film is formed, in some cases, in a portion of the island-shaped semiconductor film, which is in contact with the cavities 318. However, the insulating film described in Patent Document 2 is supposed to have a thickness of several μm to several hundreds μm, and the natural oxide film is about several nm thick, which is remarkably thinner than the insulating film. Thus, it can be said that parasitic capacitance or junction capacitance of the transistor can be reduced more or self-heating can be suppressed more in the present invention than in the case where the insulating film is formed to the above-described thickness in the portion of the island-shaped semiconductor film, which is in contact with the cavities.

Note that, although the case where the cavities 318 are filled with gas is described in this embodiment mode, the present invention is not limited to this structure. For example, the cavities 318 may be filled with a material that has lower relative permittivity than an inorganic insulating film of silicon oxide or the like, for example, a porous insulating film (a porous material) including a large number of pores therein.

Note that, in this embodiment mode, the insulating film 311 is formed first so as to be in contact with the semiconductor film 317, and then the insulating film 311 and the insulating film 316 formed over the base substrate 314 are bonded to each other. Thus, interface state density at the interface between the semiconductor film 317 and the insulating film 311 can be more uniform in this case than in the case where the semiconductor film 317 and the insulating film 311 are bonded to each other. Therefore, variation in characteristics such as threshold voltage of the transistor using the island-shaped semiconductor film formed by patterning of the semiconductor film 317 can be further suppressed.

This embodiment mode can be implemented in combination with the above-described embodiment mode as appropriate.

Embodiment Mode 6

In this embodiment mode, an example of a method for manufacturing a transistor using a semiconductor film which is formed by the formation method described in Embodiment Mode 3 will be described. Note that a transistor can also be manufactured using a semiconductor film which is formed by the formation method described in Embodiment Mode 4 or Embodiment Mode 5.

Figure 10A:
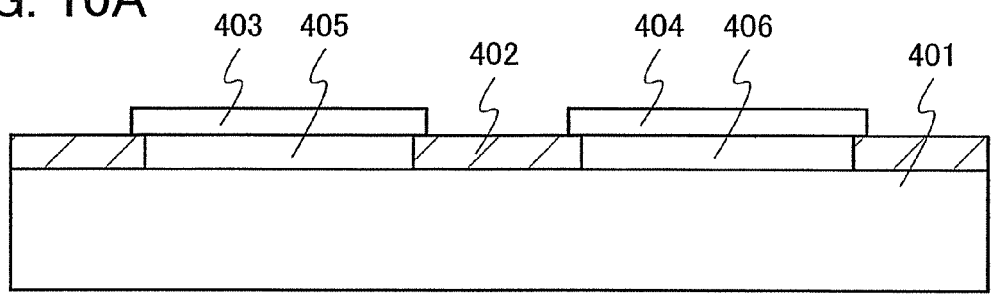
FIGS. 10A to 10D are views showing a manufacturing method of a semiconductor device of the present invention.

First, as shown in FIG. 10A, an island-shaped semiconductor film 403 and an island-shaped semiconductor film 404 are formed over a base substrate 401 with an insulating film 402 including openings interposed therebetween. In the case of using the formation method described in Embodiment Mode 3, the insulating film 402 and the island-shaped semiconductor films 403 and 404 are bonded, whereby the island-shaped semiconductor films 403 and 404 are bonded to the base substrate 410. A cavity 405 is formed with the opening included in the insulating film 402 between the base substrate 401 and the island-shaped semiconductor film 403, and a cavity 406 is formed with the opening included in the insulating film 402 between the base substrate 401 and the island-shaped semiconductor film 404.

An impurity may be added to the island-shaped semiconductor films 403 and 404 in order to control the threshold voltage. For example, in the case of adding boron as a p-type impurity, boron is preferably added at a concentration of greater than or equal to $5 \times 10^{17}$ cm$^{-3}$ and less than or equal to $1 \times 10^{18}$ cm$^{-3}$. The addition of the impurity may be performed before the semiconductor film is transferred to the base substrate 401 or after the transfer.

Hydrogenation treatment may be performed after the island-shaped semiconductor films 403 and 404 are formed and before gate insulating films 407 are formed. For example, the hydrogenation treatment is performed at 350° C. for about two hours in a hydrogen atmosphere.

Figure 10B:
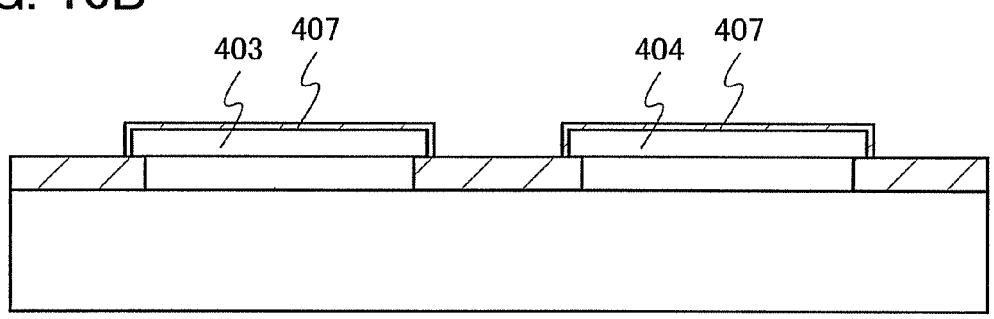

Next, as shown in FIG. 10B, the gate insulating films 407 are formed so as to cover the island-shaped semiconductor films 403 and 404. The gate insulating films 407 can be formed by oxidation or nitridation of surfaces of the island-shaped semiconductor films 403 and 404. High-density plasma treatment is performed using, for example, a mixed gas of a rare gas such as He, Ar, Kr, or Xe and oxygen, nitrogen oxide, ammonium, nitrogen, hydrogen, or the like. In this case, when plasma is excited by introduction of microwaves, plasma with a low electron temperature and high density can be generated. The surfaces of the semiconductor films are oxidized or nitrided by oxygen radicals (OH radicals may be included) or nitrogen radicals (NH radicals may be included) which are generated by such high-density plasma, whereby insulating films are formed to a thickness of 1 to 20 nm, desirably 5 to 10 nm so as to be in contact with the semiconductor films. The insulating films with a thickness of 5 to 10 nm are used as the gate insulating films 407.

Since the oxidation or nitridation of the semiconductor film by the above-described high-density plasma treatment progresses under a solid-phase reaction, interface state density between the gate insulating films and the island-shaped semiconductor films 403 and 404 can be extremely low. In addition, the semiconductor films are directly oxidized or nitrided by the high-density plasma treatment, whereby variation in the thickness of the insulating film which is to be formed can be suppressed. Moreover, in the case where the semiconductor films have crystallinity, the surfaces of the semiconductor films are oxidized by solid state reaction using the high-density plasma treatment, whereby rapid oxidation only in crystal grain boundaries can be prevented and the gate insulating film with good uniformity and low interface state density can be formed. A transistor including the insulating film formed by the high-density plasma treatment in part of the gate insulating film or as the whole gate insulating film of the transistor can have little variation in the characteristics.

Alternatively, each of the gate insulating films 407 may be formed of a single layer of a film containing silicon oxide, silicon oxynitride, silicon nitride, hafnium oxide, aluminum oxide, or tantalum oxide which are formed by a plasma CVD method, a sputtering method, or the like, or a stacked layer thereof.

Figure 10C:
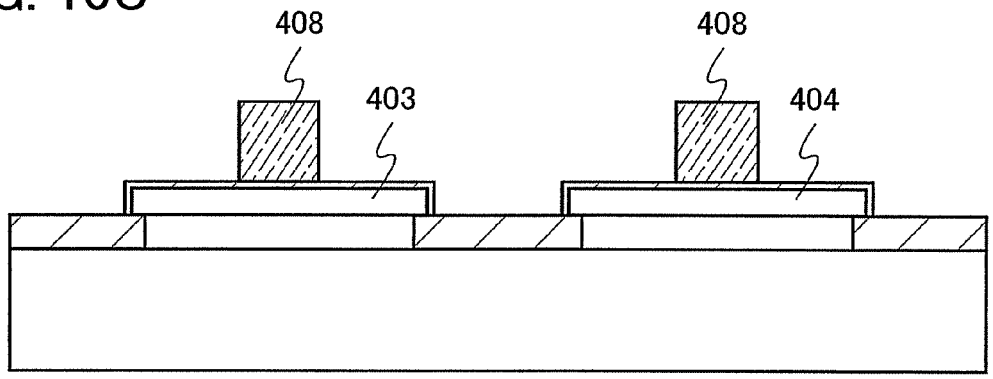

Next, as shown in FIG. 10C, conductive films are formed over the gate insulating films 407, and then the conductive films are processed (patterned) into predetermined shapes, whereby electrodes 408 are formed over the island-shaped semiconductor films 403 and 404. A CVD method, a sputtering method, or the like can be used for forming the conductive films. Tantalum (Ta), tungsten (W), titanium (Ti), molybdenum (Mo), aluminum (Al), copper (Cu), chromium (Cr), niobium (Nb), or the like can be used for forming the conductive films. Alternatively, an alloy containing the above-described metal as its main component or a compound containing as the above-described metal may be used. Further alternatively, the conductive films may be formed using a semiconductor such as polycrystalline silicon which is formed by addition of an impurity element imparting a conductivity type, such as phosphorus, to a semiconductor film.

As a combination of two conductive films, tantalum nitride or tantalum (Ta) can be used for a first layer, and tungsten (W) can be used for a second layer. Besides the above-described example, tungsten nitride and tungsten; molybdenum nitride and molybdenum; aluminum and tantalum; aluminum and titanium; and the like can be given. Since tungsten and tantalum nitride have high thermal resistance, thermal treatment for thermal activation can be performed after the first conductive film and the second conductive film are formed. As a combination of the second conductive film, for example, silicon doped with an impurity imparting n-type conductivity and NiSi (nickel silicide); silicon doped with an impurity imparting n-type conductivity and $WSi_x$; or the like can be used.

In addition, although each of the electrodes 408 is formed of a single-layer conductive film in this embodiment, this embodiment mode is not limited to this structure. Each of the electrodes 408 may be formed of a plurality of conductive films which is stacked. In the case of a three-layer structure in which three or more conductive films are stacked, a stacked structure including a molybdenum film, an aluminum film, and a molybdenum film may be used.

As masks used when the electrodes 408 are formed, instead of resist, silicon oxide, silicon oxynitride, or the like may be used. Although, in this case, a step of forming the mask made of silicon oxide or silicon nitride by patterning is added, since the reduction in film thickness and width of the mask at the time of etching is less than that in the case of using a resist mask, the electrodes 408 with desired widths can be formed. Alternatively, the electrodes 408 may be formed selectively by a droplet discharge method without using the mask.

Note that a droplet discharge method refers to a method in which droplets containing a predetermined composition are discharged from a pore to form a predetermined pattern, and an ink-jet method or the like is included in the category.

The electrodes 408 can be etched into desired tapered shapes by an ICP (inductively coupled plasma) etching method and appropriate control of the etching conditions (e.g., the amount of electric power applied to a coiled electrode layer, the amount of electric power applied to an electrode layer on the substrate side, and the electrode temperature on the substrate side). The angle of the tapered shape depends on the shape of the mask. Note that as an etching gas, a chlorine-based gas such as $Cl_2$, $BCl_3$, $SiCl_4$, or $CCl_4$, a fluorine-based gas such as $CF_4$, $SF_6$, or $NF_3$, or oxygen can be used as appropriate.

In the case of using a high dielectric constant substance (a high-k material) for the gate insulating film 407, the electrode 408 is formed of polycrystalline silicon, silicide, a metal, or metal nitride. In particular, it is most desirable that the electrode 408 be formed of a metal or metal nitride in the case of using a high dielectric constant substance. For example, the conductive film which is in contact with the gate insulating film 407 is formed of a metal nitride material and the conductive film thereover is formed of a metal material. This combination makes it possible to prevent a depletion layer from being extended in the electrode 408 even when the gate insulating film 407 is thinned and to prevent drive capability of a transistor from being deteriorated even when the transistor is miniaturized.

Figure 10D:
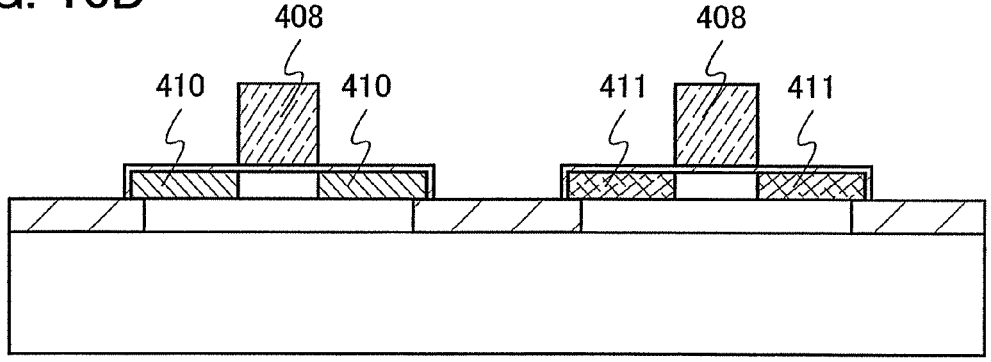

Next, as shown in FIG. 10D, an impurity element imparting one conductivity type is added to the semiconductor films 403 and 404 with the use of the electrodes 408 as masks. In this embodiment mode, an impurity element imparting p-type conductivity (e.g., boron) is added to the semiconductor film 404, and an impurity element imparting n-type conductivity (e.g., phosphorus or arsenic) is added to the semiconductor film 403. Note that when the impurity element imparting p-type conductivity is added to the semiconductor film 404, the semiconductor film 403 to which the n-type impurity is added is covered with a mask or the like so that the addition of the impurity element imparting p-type conductivity can be performed selectively. Alternatively, when the impurity element imparting n-type conductivity is added to the semiconductor film 403, the semiconductor film 404 to which the p-type impurity is added is covered with a mask or the like so that the addition of the impurity element imparting n-type conductivity can be performed selectively. Alternatively, after the impurity element imparting p-type or n-type conductivity is added to the semiconductor film 403 and the semiconductor film 404, either one of the impurity element imparting p-type conductivity or the impurity element imparting n-type conductivity may be selectively added to only one of the semiconductor film 403 or the semiconductor film 404 at higher concentration. By the above-described addition of the impurity, impurity regions 410 and 411 are formed in the semiconductor films 403 and 404, respectively.

Figure 11A:
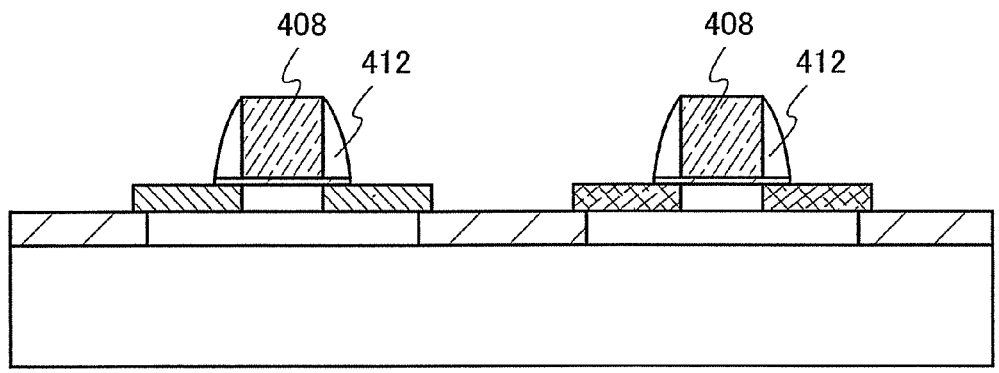
FIGS. 11A to 11C are views showing a manufacturing method of a semiconductor device of the present invention.

Next, as shown in FIG. 11A, a sidewall 412 is formed on side surfaces of each of the electrode 408. For example, the sidewall 412 can be formed in such a manner that another insulating film is formed so as to cover the gate insulating film 407 and the electrode 408, and the insulating film is partially etched by anisotropic etching in which etching is performed mainly in a perpendicular direction. The newly-formed insulating film is partially etched by the above-described anisotropic etching, whereby the sidewall 412 is formed on the side surfaces of each of the electrodes 408. The insulating film for forming the sidewall 412 can be formed of a single layer such as a silicon film, a silicon oxide film, a silicon oxynitride film, or a silicon nitride oxide film, or a film containing an organic material such as an organic resin which are formed by a plasma CVD method, a sputtering method, or the like, or a stacked layer thereof. In this embodiment mode, a silicon oxide film is formed to a thickness of 100 nm by a plasma CVD method. In addition, as an etching gas, a mixed gas of $CHF_3$ and He can be used. Note that the steps of forming the sidewall 412 are not limited to these steps.

Figure 11B:
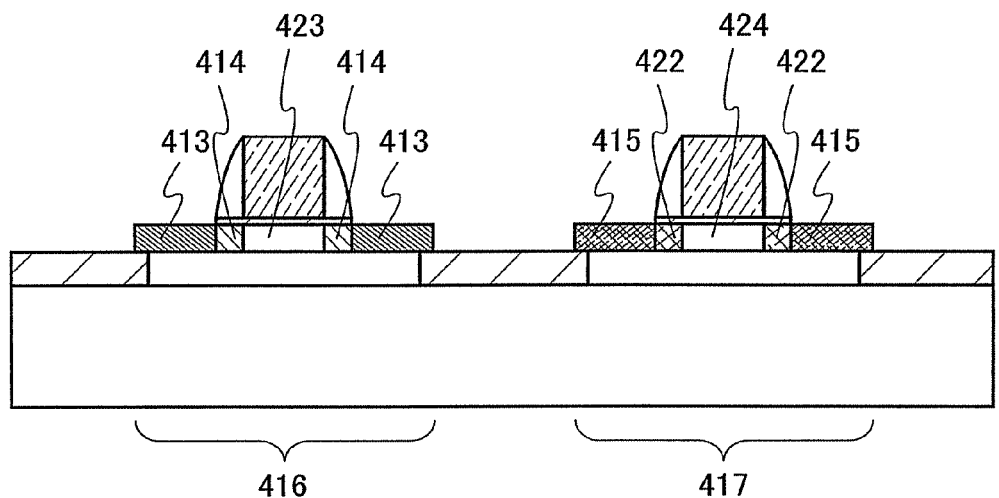

Next, as shown in FIG. 11B, an impurity element imparting one conductivity type is added to the semiconductor films 403 and 404 with the use of the sidewalls 412 as masks. Note that the impurity elements imparting the same conductivity type as the impurity elements which have been added to the semiconductor films 403 and 404 in the previous step are added to the semiconductor films 403 and 404 at higher concentration than in the previous step. Note that when the impurity element imparting p-type conductivity is added to the semiconductor film 404, the semiconductor film 403 to which the n-type impurity is added is covered with a mask or the like so that the addition of the impurity element imparting p-type conductivity can be performed selectively. Alternatively, when the impurity element imparting n-type conductivity is added to the semiconductor film 403, the semiconductor film 404 to which the p-type impurity element is added is covered with a mask or the like so that the addition of the impurity element imparting n-type conductivity can be performed selectively.

By the above-described addition of the impurity element, a pair of high concentration impurity regions 413, a pair of low concentration impurity regions 414, and a channel formation region 423 are formed in the semiconductor film 403. One of the high concentration impurity regions 413 functions as a source and the other functions as a drain, and the low concentration impurity regions 414 function as LDD (lightly doped drain) regions. In addition, by the above-described addition of the impurity element, a pair of high concentration impurity regions 415, a pair of low concentration impurity regions 422, and a channel formation region 424 are formed in the semiconductor film 404.

Note that the sidewall 412 formed over the semiconductor film 404 and the sidewall 412 formed over the semiconductor film 403 may be formed so as to have the same width in the channel flow direction, or may be formed so as to have different widths. It is preferable that the width of the sidewall 412 over the semiconductor film 404 which constitutes a part of a p-type transistor be larger than the width of the sidewall 412 over the semiconductor film 403 which constitutes a part of an n-type transistor. This is because boron which is added for forming a source and a drain in the p-type transistor is easily diffused and a short channel effect is easily induced. When the width of the sidewall 412 in the p-type transistor is made larger than that of the sidewall 412 in the n-channel transistor, boron can be added to the source and the drain at high concentration, and thus the resistance of the source and the drain can be reduced.

Next, a silicide layer may be formed by silicification of the semiconductor films 403 and 404 in order to further reduce the resistance of the source and the drain. The silicification is performed in such a manner that the a metal is brought into contact with the semiconductor film, and silicon in the semiconductor film is made to react with the metal by heat treatment, a GRTA method, an LRTA method, or the like. Cobalt silicide or nickel silicide may be used for the silicide layer. In the case where the semiconductor films 403 and 404 are thin, silicide reaction may be proceeded to bottoms of the semiconductor films 403 and 404 in this region so that the semiconductor films 403 and 404 are fully silicificated. As a metal material used for the silicification, the following can be used: titanium (Ti), nickel (Ni), tungsten (W), molybdenum (Mo), cobalt (Co), zirconium (Zr), hafnium (Ha), tantalum (Ta), vanadium (V), neodymium (Nd), chromium (Cr), platinum (Pt), palladium (Pd), or the like. Alternatively, silicide may be formed by laser irradiation or light irradiation using a lamp or the like.

Through the above-described series of steps, an n-channel transistor 416 and a p-channel transistor 417 are manufactured.

Figure 11C:
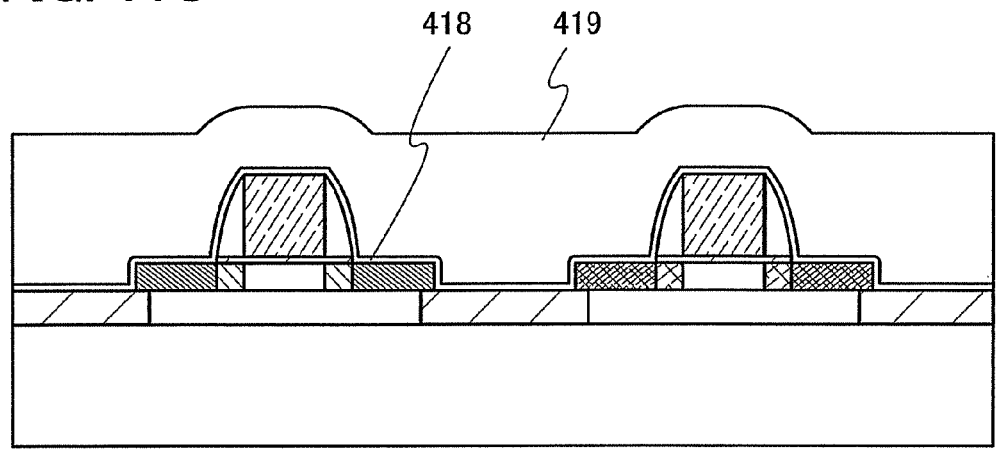

Next, as shown in FIG. 11C, an insulating film 418 is formed in order to protect the transistors 416 and 417. Although the insulating film 418 is not necessarily provided, the provision of the insulating film 418 makes it possible to prevent impurities such as an alkali metal or an alkaline earth metal from entering the transistors 416 and 417. Specifically, it is desirable to use silicon nitride, silicon nitride oxide, aluminum nitride, aluminum oxide, silicon oxide, or the like for the insulating film 418. In this embodiment mode, a silicon oxynitride film formed to a thickness of about 600 nm is used as the insulating film 418. In this case, the above-described hydrogenation step may be performed after the formation of the silicon oxynitride film.

Next, an insulating film 419 is formed over the insulating film 418 so as to cover the transistors 416 and 417. An organic material having heat resistance, such as polyimide, acrylic, polyimideamide, benzocyclobutene, polyamide, or epoxy can be used for the insulating film 419. Besides the above-described organic material, the following can be used: a low dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like. The siloxane-based resin may include, besides hydrogen, at least one of fluorine, an alkyl group, or aromatic hydrocarbon as a substituent. Note that the insulating film 419 may be formed of a layer in which a plurality of insulating films each formed of the above-described material is stacked. A surface of the insulating film 419 may be planarized by a CMP method, liquid jet polishing, or the like.

Note that the siloxane-based resin corresponds to a resin including a Si—O—Si bond formed using a siloxane-based material as a starting material. The siloxane-based resin may include, besides hydrogen, at least one of fluorine, an alkyl group, or aromatic hydrocarbon as a substituent.

For the formation of the insulating film 419, the following method can be used depending on the material of the insulating film 419: a CVD method, a sputtering method, an SOG method, a spin coating method, a dipping method, a spray coating method, a droplet discharge method (e.g., an inkjet method, screen printing, or an offset printing), a doctor knife, a roll coater, a curtain coater, a knife coater, or the like.

Figure 12:
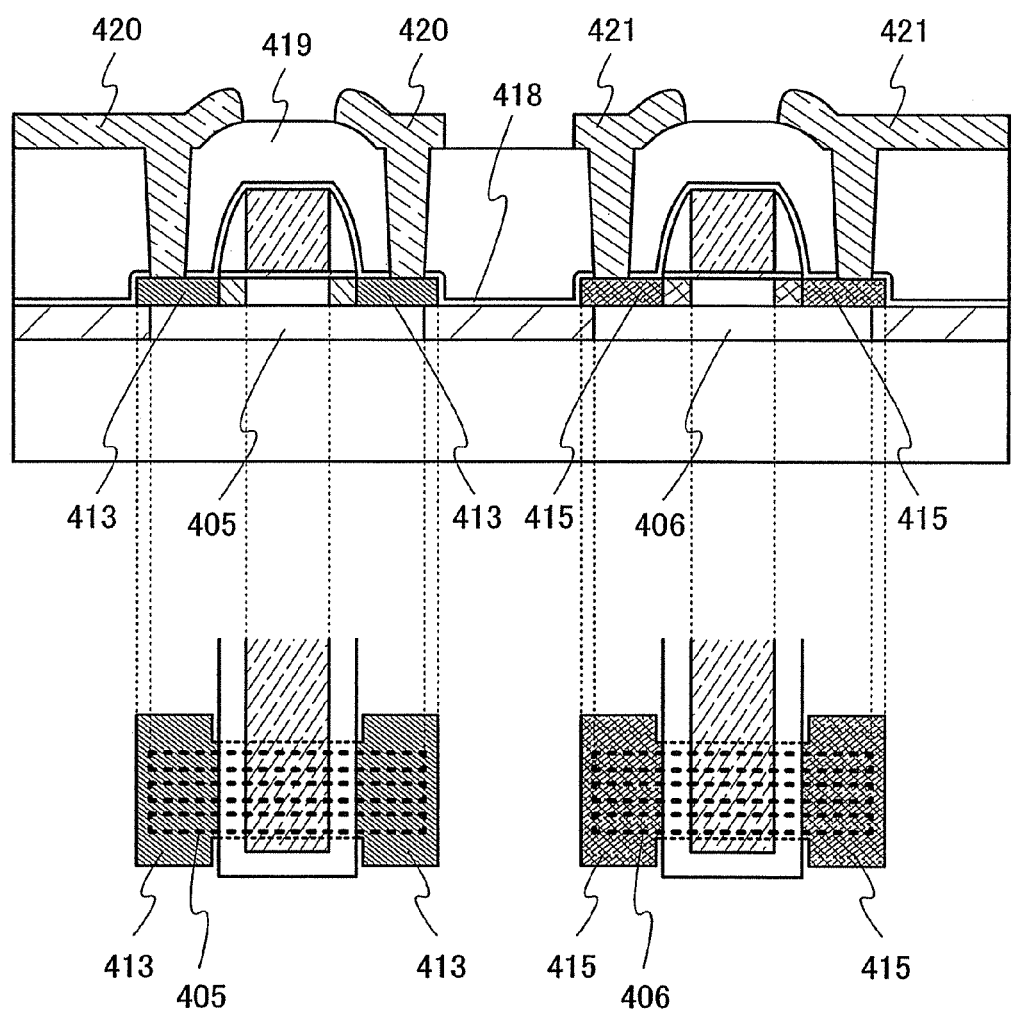
FIG. 12 is a view showing a manufacturing method of a semiconductor device of the present invention.

Next, as shown in FIG. 12, contact holes are formed in the insulating films 418 and 419 so that the island-shaped semiconductor films 403 and 404 are partially exposed. Then, conductive films 420 and 421 are formed to be in contact with the island-shaped semiconductor films 403 and 404, respectively through the contact holes. Although a mixed gas of $CHF_3$ and He is used as a gas used at the time of forming the contact holes, the gas is not limited to the mixed gas.

The conductive films 420 and 421 can be formed by a CVD method, a sputtering method, or the like. Specifically, the following can be used for the conductive films 420 and 421: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as its main component or a compound containing the above-described metal may be used. The conductive films 420 and 421 can be formed of a single layer of a film formed using the above-described metal or a layer in which a plurality of films each formed using the above-described metal is stacked.

As an example of an alloy containing aluminum as its main component, an alloy containing aluminum as its main component and also containing nickel is given. In addition, an alloy containing aluminum as its main component and also containing nickel and one or both of nickel and silicon can also be given as the example thereof. Since aluminum and aluminum silicon have low resistance values and are inexpensive, aluminum and aluminum silicon are suitable for a material for forming the conductive films 420 and 421. In particular, generation of hillocks in resist baking can be prevented more in the case where an aluminum silicon (Al—Si) film is used for forming the conductive films 420 and 421 by patterning than in the case where an aluminum film is used. Alternatively, Cu, instead of silicon (Si), may be mixed into the aluminum film at about 0.5 wt %.

For example, a stacked structure including a barrier film, an aluminum silicon film, and a barrier film or a stacked structure including a barrier film, an aluminum silicon film, a titanium nitride film, and a barrier film may be used for the conductive films 420 and 421. Note that the barrier film refers to a film formed using titanium, a nitride of titanium, molybdenum, or a nitride of molybdenum. When the barrier films are formed so that the aluminum silicon film is interposed therebetween, generation of hillocks of aluminum or aluminum silicon can be further prevented. Moreover, when the barrier film is formed using titanium that is a highly-reducible element, even if a thin oxide film is formed over the island-shaped semiconductor films 403 and 404, the natural oxide film is reduced by the titanium contained in the barrier film, whereby preferable contact between the conductive films 420 and 421 and the island-shaped semiconductor films 403 and 404 can be obtained. Alternatively, a layer in which a plurality of barrier films is stacked may be used. In that case, for example, a five-layer structure in which titanium, titanium nitride, aluminum silicon, titanium, and titanium nitride are stacked from the lowest layer can be used for the conductive films 420 and 421.

Note that the conductive film 420 is connected to the high concentration impurity region 413 of the n-channel transistor 416. The conductive film 421 is connected to the high concentration impurity region 415 of the p-channel transistor 417.

Top views of the n-channel transistor 416 and the p-channel transistor 417 are shown in FIG. 12. In this embodiment mode, each of a plurality of cavities 405 overlaps with the pair of impurity regions 413 and the channel formation region 423. In addition, each of a plurality of cavities 406 overlaps with the pair of impurity regions 415 and the channel formation region 424. However, the present invention is not limited to this structure. The number of cavities 405 and 406 and the layout of the cavities 405 and 406 are not limited to the structure described in this embodiment mode.

In addition, although the case where each of the n-channel transistor 416 and the p-channel transistor 417 includes one gate electrode 408 functioning as the gate is shown as an example in this embodiment mode, the present invention is not limited to this structure. The transistor included in the semiconductor device of the present invention may include a plurality of electrodes functioning as gates, and also may have a multi-gate structure in which the plurality of electrodes are electrically connected to one another.

Moreover, the transistor included in the semiconductor device of the present invention may have a gate planar structure.

Since the island-shaped semiconductor film is formed over the base substrate in the semiconductor device using the manufacturing method of the present invention, element separation is not needed; thus, the process can be simplified. In addition, in the manufacturing method of the present invention, the cavities 405 and 406 are formed by etching of the insulating film 402; thus, the cavities 405 and 406 with desired depths and shapes can be formed precisely through a simple procedure.

This embodiment mode can be implemented in combination with the above-described embodiment mode as appropriate.

Embodiment 1

In this embodiment, the configuration of various circuits each using a transistor having an SON structure of the present invention will be described in detail, using an inverter as an example. A circuit diagram of the inverter is shown in FIG. 13A, and a top view of the inverter shown in FIG. 13A is shown in FIG. 13B as an example.

Figure 13A:
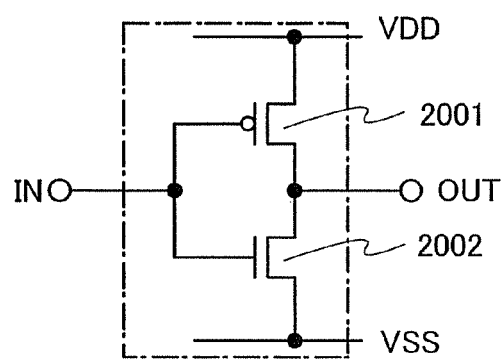
FIGS. 13A to 13C are views showing a structure of an inverter included in a semiconductor device of the present invention.

The inverter shown in FIG. 13A has p-channel transistors 2001 and n-channel transistors 2002. The transistors 2001 and the transistors 2002 are connected in series. Specifically, drains of the transistors 2001 and drains of the transistors 2002 are connected. The electric potential of the drains of the transistors 2001 and the drains of the transistors 2002 are applied to an output terminal OUT.

In addition, gates of the transistors 2001 and gates of the transistors 2002 are connected. The potential of a signal inputted to an input terminal IN is applied to the gates of the transistors 2001 and the gates of the transistors 2002. A high level voltage VDD is applied to sources of the transistors 2001 while a low level voltage VSS is applied to sources of the transistors 2002.

Figure 13B:
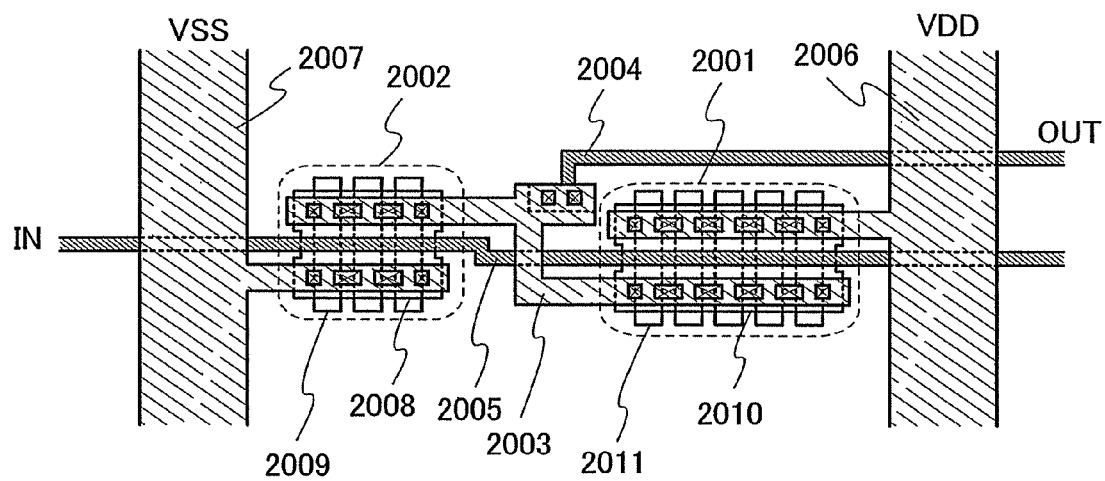

In the inverter shown in FIG. 13B, the drains of the transistors 2001 and the drains of the transistors 2002 are electrically connected through a wiring 2003. The wiring 2003 is connected to a wiring 2004. Therefore, the potential of the drains of the transistors 2001 and the drains of the transistors 2002 are applied as the potential of the output terminal OUT to a circuit in the next stage through the wiring 2003 and the wiring 2004.

In addition, in the inverter shown in FIG. 13B, parts of a wiring 2005 function as the gates of the transistors 2001 and the gates of the transistors 2002. The potential applied to the wiring 2005 is applied to the gates of the transistors 2001 and the gates of the transistors 2002 as the potential of the input terminal IN. The high level voltage VDD is applied to the sources of the transistors 2001 through a wiring 2006, and the high level voltage VSS is applied to the sources of the transistors 2002 through a wiring 2007.

Cavities 2009 are provided between a substrate and a semiconductor film 2008 included in the transistors 2001. Further, cavities 2011 are formed between the substrate and a semiconductor film 2010 included in the transistors 2002. For the purpose of defining the positional relationships between the semiconductor film 2008 and the cavities 2009 and between the semiconductor film 2010 and the cavities 2011, only the semiconductor film 2008, the cavities 2009, the semiconductor film 2010, and the cavities 2011 in the inverter shown in FIG. 13B are shown in FIG. 13C.

Figure 13C:
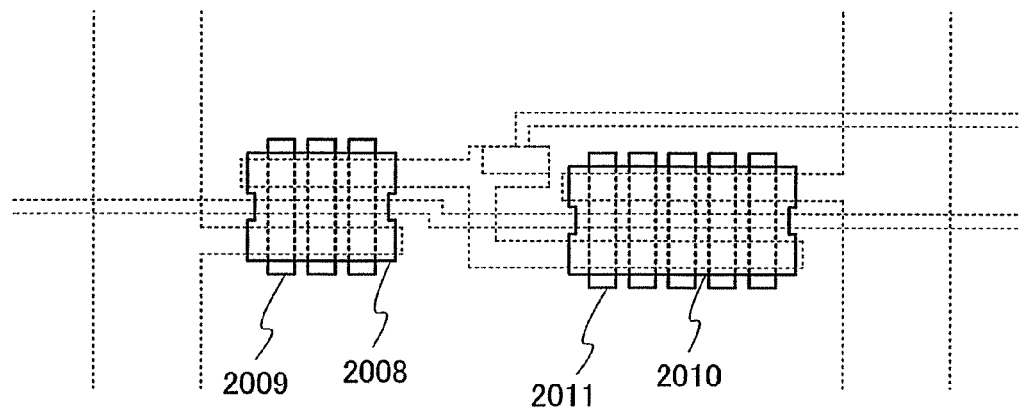

As shown in FIG. 13C, a plurality of the cavities 2009 is formed between the substrate and the semiconductor film 2008. The plurality of cavities 2009 is formed in regions which overlap with the sources, channel formation regions, and the drains of the transistors 2001. Similarly, a plurality of cavities 2011 is formed between the substrate and the semiconductor film 2010. The plurality of the cavities 2011 is formed in regions which overlap with the sources, channel formation regions, and the drains of the transistors 2002.

Note that the plurality of cavities 2009 and the plurality of cavities 2011 which overlap with the semiconductor film 2008 and the semiconductor film 2010, respectively, are provided in FIG. 13B and FIG. 13C; however, the present invention is not limited to this structure. Alternatively, one cavity may be formed under the semiconductor film. If the area where one cavity is formed is the same as the area where a plurality of cavities is formed, transistors having higher physical strength can be formed in the case of forming the plurality of cavities than the case of forming the plurality of cavities. Meanwhile, in the case of forming one cavity, since a cavity can be formed in a larger area under the semiconductor film, junction capacitance can be reduced more than the case of forming a plurality of cavities.

In addition, the cavities 2009 and the cavities 2011 are formed in the regions which overlap with the sources, the channel formation regions, the drains of the transistors 2001 and the transistors 2002, respectively, in FIG. 13B and FIG. 13C; however, the present invention is not limited to this structure. Alternatively, the cavities may be formed so as to overlap with either the sources or the drains. In this case, the cavities may overlap with the channel formation regions, which is optional. When the cavities overlap with at least the sources or the drains, junction capacitance can be reduced more than the case of forming cavities which overlap only with the channel formation regions. Alternatively, when the cavities which overlap with at least the channel formation regions are formed, self-heating can be reduced more than the case of forming cavities which overlap with only the sources or the drains.

This embodiment can be implemented in combination with any of the above-described embodiment modes as appropriate.

Embodiment 2

In this embodiment, the configuration of various circuits each using a transistor having an SON structure of the present invention will be described in detail, using a NAND as an example. A circuit diagram of the NAND is shown in FIG. 14A, and a top view of the NAND shown in FIG. 14A is shown in FIG. 14B as an example.

Figure 14A:
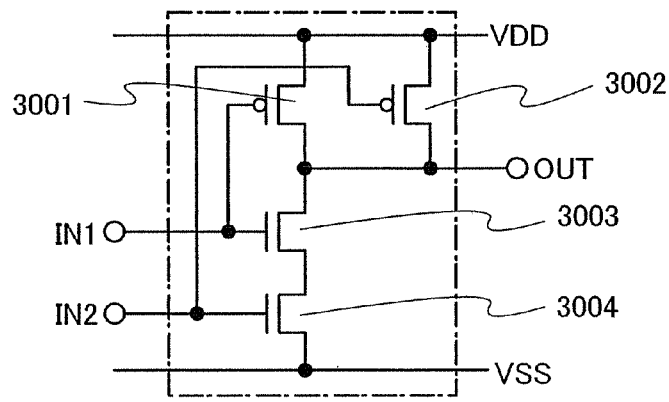
FIGS. 14A to 14C are views showing a structure of a NAND included in a semiconductor device of the present invention.

The NAND shown in FIG. 14A has p-channel transistors 3001, p-channel transistors 3002, n-channel transistors 3003, and n-channel transistors 3004. The transistors 3001, the transistors 3003, and the transistors 3004 are connected in series in that order. Meanwhile, the transistors 3001 and the transistors 3002 are connected in parallel.

Specifically, a high level voltage VDD is applied to either sources or drains of the transistors 3001 and the others are connected to an output terminal OUT. A high level voltage VDD is applied to either sources or drains of the transistors 3002 and the others are connected to the output terminal OUT. A low level voltage VSS is applied to either sources or drains of the transistors 3004. Either sources or drains of the transistors 3003 are connected to the output terminal OUT. Further, the others of the sources and drains of the transistors 3003 are connected to the others of the sources and drains of the transistors 3004. The potential of an input terminal IN1 is applied to gates of the transistors 3001 and gates of the transistors 3003. Further, the potential of an input terminal IN2 is applied to gates of the transistors 3002 and gates of the transistors 3004.

Figure 14B:
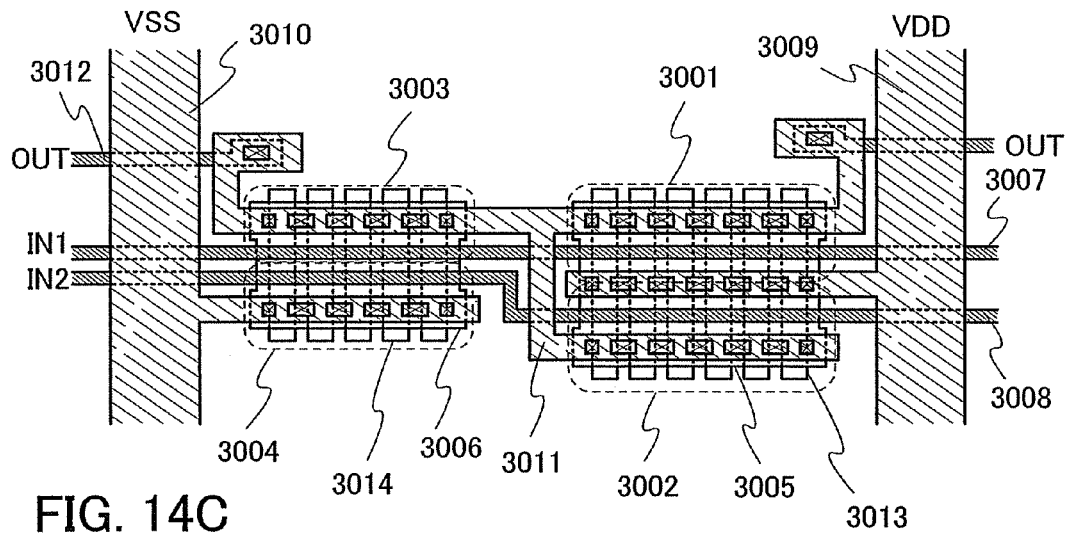

In the NAND shown in FIG. 14B, the transistors 3001 and the transistors 3002 which are connected in series share a semiconductor film 3005. Meanwhile, the transistors 3003 and the transistors 3004 which are connected in series share a semiconductor film 3006. Further, parts of a wiring 3007 function as the gates of the transistors 3001 and the gates of the transistors 3003. The potential applied to the wiring 3007 is applied to the gates of the transistors 3001 and the gates of the transistors 3003 as the potential of the input terminal IN1.

Parts of a wiring 3008 function as the gates of the transistors 3002 and the gates of the transistors 3004. The potential applied to the wiring 3008 is applied to the gates of the transistors 3002 and the gates of the transistors 3004 as the potential of the input terminal IN2.

The high level voltage VDD is applied to either the sources or the drains of the transistors 3001 and either the sources or the drains of the transistors 3002 through a wiring 3009. Further, the low level voltage VSS is applied to either the sources or the drains of the transistors 3004 through a wiring 3010. The potential of the others of the sources and the drains of the transistors 3001, the others of the sources and the drains of the transistors 3002, and either the sources or the drains of the transistors 3003 is applied as the potential of the output terminal OUT to a circuit in the next stage through a wiring 3011 and a wiring 3012.

Cavities 3013 are formed between the semiconductor film 3005 and a substrate. Further, cavities 3014 are formed between the semiconductor film 3005 and the substrate. For the purpose of defining the positional relationships between the semiconductor film 3005 and the cavities 3013 and between the semiconductor film 3006 and the cavities 3014, only the semiconductor film 3005, the cavities 3013, the semiconductor film 3006, and the cavities 3014 in the NAND shown in FIG. 14B are shown in FIG. 14C.

Figure 14C:
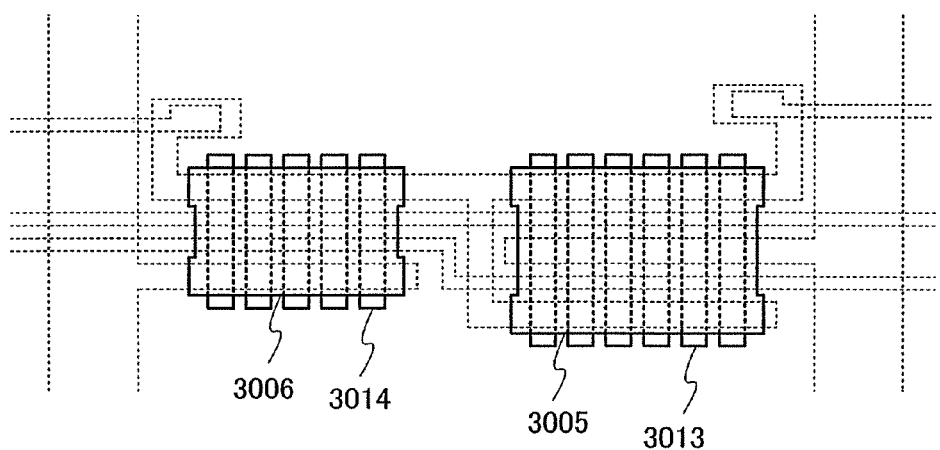

As shown in FIG. 14C, a plurality of cavities 3013 is formed between the semiconductor film 3005 and the substrate. The plurality of cavities 3013 is formed in regions which overlap with the sources, channel formation regions, and the drains of the transistors 3001 and the sources, channel formation regions, and the drains of the transistors 3002. Similarly, a plurality of cavities 3014 is formed between the semiconductor film 3006 and the substrate. The plurality of cavities 3014 is formed in regions which overlap with the sources, channel formation regions, and the drains of the transistors 3003 and the sources, channel formation regions, and the drains of the transistors 3004.

Note that the plurality of cavities 3013 and the plurality of the cavities 3014 which overlap with the semiconductor film 3005 and the semiconductor film 3006, respectively, are provided in FIG. 14B and FIG. 14C; however, the present invention is not limited to this structure. Alternatively, one cavity may be formed under the semiconductor film. If the area where one cavity is formed is the same as the area where a plurality of cavities is formed, transistors having higher physical strength can be formed in the case of forming the plurality of cavities than the case of forming the plurality of cavities. Meanwhile, in the case of forming one cavity, since a cavity can be formed in a larger area under the semiconductor film, junction capacitance can be reduced more than the case of forming a plurality of cavities.

In addition, the cavities 3013 are formed in the regions which overlap with the sources, the channel formation regions, and the drains of each of the transistors 3001 the transistors 3002 in FIGS. 14B and 14C, and the cavities 3014 are formed in the regions which overlap with the sources, the channel formation regions, and the drains of each of the transistors 3003 and the transistors 3004 in FIGS. 14B and 14C; however, the present invention is not limited to this structure. Alternatively, the cavities may be formed so as to overlap with either the sources or the drains. In this case, the cavities may overlap with the channel formation regions, which is optional. When the cavities overlap with at least the sources or the drains, junction capacitance can be reduced more than the case of forming cavities which overlap only with the channel formation regions. Alternatively, when the cavities which overlap with at least the channel formation regions are formed, self-heating can be reduced more than the case of forming cavities which overlap with only the sources or the drains.

In FIG. 14B and FIG. 14C, the transistors 3001 and the transistors 3002 share the semiconductor film 3005 and the cavities 3013; however, the present invention is not limited to the structure. When a plurality of transistors share a semiconductor film and cavities, while the area on the substrate, which is occupied by the plurality of transistors can be kept small, a transistor having lower junction capacitance can be formed.

This embodiment can be implemented in combination with any of the above-described embodiment modes and embodiment as appropriate.

Embodiment 3

Figure 15:
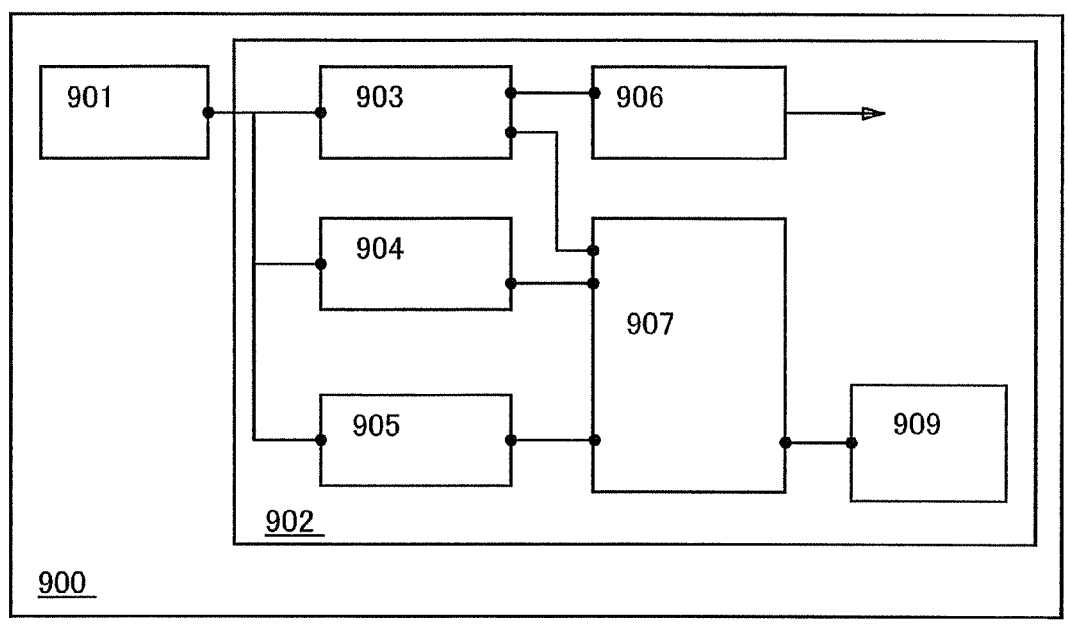
FIG. 15 is a diagram showing a structure of an RF tag which is one of semiconductor devices of the present invention.

In this embodiment, a structure of an RF tag which is one of semiconductor devices of the present invention will be described with reference to FIG. 15. FIG. 15 is a block diagram illustrating one mode of an RF tag of the present invention. In FIG. 15, an RF tag 900 includes an antenna 901 and an integrated circuit 902. The integrated circuit 902 includes a power supply circuit 903, a demodulation circuit 904, a modulation circuit 905, a regulator 906, a control circuit 907, and a memory 909. The rectifier circuit of the present invention can be used in the power supply circuit 903 and the demodulation circuit 904.

When radio waves are transmitted from an interrogator, the radio waves are converted into an AC voltage in the antenna 901. In the power supply circuit 903, the AC voltage from the antenna 901 is rectified to generate a voltage for a power supply. The voltage for a power supply, which is generated in the power supply circuit 903, is fed to the control circuit 907 and the regulator 906. After stabilizing the voltage for a power supply from the power supply circuit 903 or after adjusting the level thereof, the regulator 906 supplies the voltage to various circuits such as the demodulation circuit 904, the modulation circuit 905, the control circuit 907, and the memory 909 in the integrated circuit 902.

The demodulation circuit 904 demodulates the AC signal received by the antenna 901 to output the signal to the control circuit 907 of a next stage. The control circuit 907 performs arithmetic processing in accordance with the signal inputted from the demodulation circuit 904 and generates a new signal. When the arithmetic processing is performed, the memory 909 can be used as a primary cache memory or a secondary cache memory. Further, the control circuit 907 analyses the signal inputted from the demodulation circuit 904, and data in the memory 909 is outputted or the content of instructions in the memory 909 is stored in accordance with the content of an instruction transmitted from the interrogator. The signal outputted from the control circuit 907 is encoded and transmitted to the modulation circuit 905. The modulation circuit 905 modulates the radio waves received by the antenna 901 in accordance with the signal. The radio waves modulated in the antenna 901 are received by the interrogator Then, data outputted from the RF tag 900 can be obtained.

Thus, communication between the RF tag 900 and the interrogator can be performed by modulating radio waves used as a carrier (carrier wave). As the carrier, there are radio waves with frequencies of 125 kHz, 13.56 MHz, 950 MHz, and the like, which vary depending on the standard. A modulation method includes various methods such as amplitude modulation, frequency modulation, and phase modulation, depending on the standard; however, any modulation method may be employed as long as it is based on the standard.

A signal transmission method can be categorized into a variety of methods such as an electromagnetic coupling method, an electromagnetic induction method, a microwave method, and the like depending on the wavelength of a carrier.

The memory 909 may be either a nonvolatile memory or a volatile memory. As the memory 909, for example, an SRAM, a DRAM, a flash memory, and an EEPROM, an FeRAM can be used.

In this embodiment, a structure of the RF tag 900 including the antenna 901 is described; however, the RF tag of the present invention does not necessarily include an antenna. In addition, the RF tag illustrated in FIG. 16 may be provided with an oscillation circuit or a secondary battery.

Figure 16:
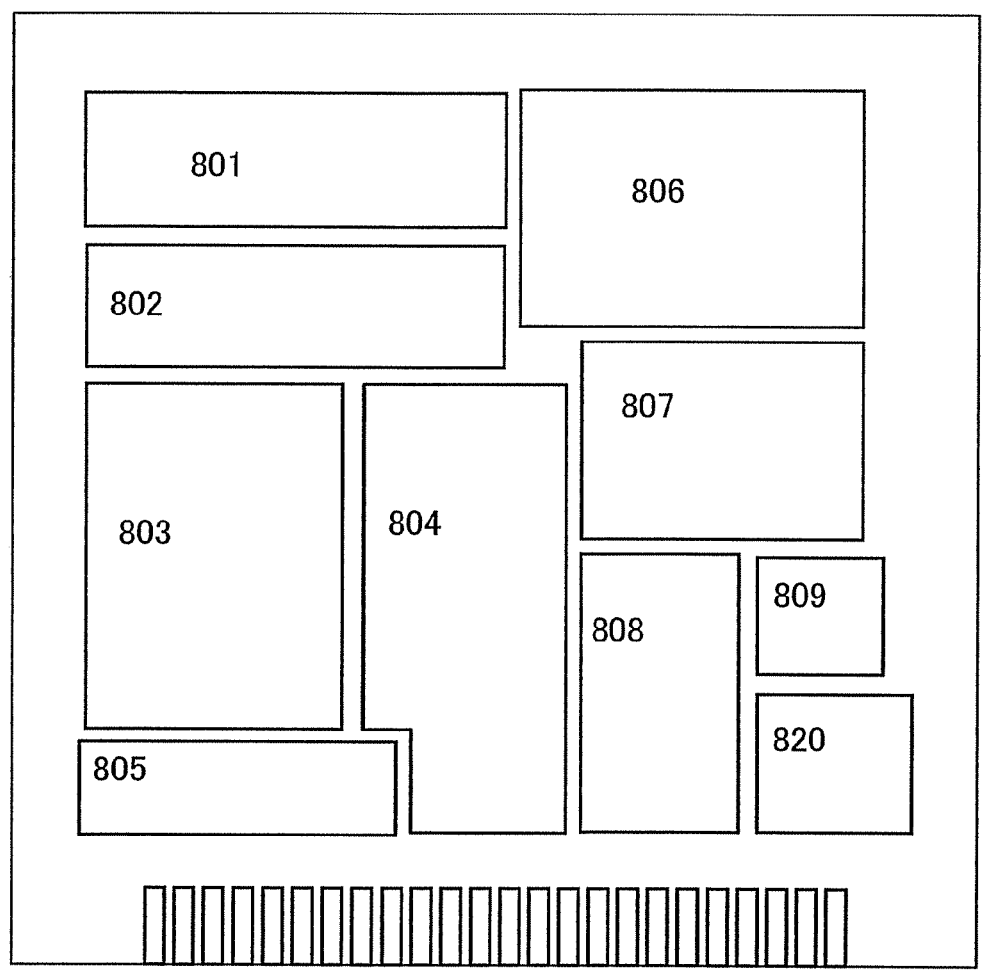
FIG. 16 is a diagram showing a structure of a CPU which is one of semiconductor devices of the present invention.

In FIG. 16, a structure of the RF tag including only one antenna is described; however, the present invention is not limited to this structure. The RF tag may include two antennas, that is, an antenna for receiving power and an antenna for receiving a signal. If the RF tag includes one antenna, in the case where both supply of power and transmission of a signal are performed with radio waves with a frequency of 950 MHz for example, a large amount of power might be transmitted to a distance to impede reception of other wireless devices. Therefore, it is desirable that power be supplied over a short distance with radio waves, the frequency of which has been reduced; however, a communication distance is inevitably short in this case. On the other hand, if the RF tag includes two antennas, frequency of radio waves for supplying power and frequency of radio waves for transmitting a signal can be separately used. For example, in the case of transmitting power, an electromagnetic induction method using radio waves with a frequency of 13.56 MHz can be used, and in the case of transmitting a signal, a radio wave method using radio waves with a frequency of 950 MHz can be used. Antennas are separately used depending on functions as described above, power can be supplied for communication only over a short distance and a signal can be transmitted even over a long distance.

In the RF tag which is one of semiconductor devices of the present invention, the integrated circuit 902 is formed using a substrate having an insulating surface or insulating substrate or a single-crystal semiconductor layer (an SOI layer) which is bonded onto an insulating substrate; therefore, not only faster processing speed but also lower power consumption can be achieved. Further, using a transistor in which junction capacitance is suppressed makes it possible to drive the RF tag at high speed. Furthermore, since the RF tag has cavities which are in contact with a semiconductor film, heat generated in driving the transistor can be released efficiently. Thus, malfunction, destruction of an element, or the like due to self-heating can be prevented.

This embodiment can be implemented in combination with any of the above-described embodiment modes and embodiments as appropriate.

Embodiment 4

In this embodiment, a structure of a CPU (central processing unit) which is one of semiconductor devices of the present invention will be described.

FIG. 16 is a block diagram illustrating a structure of the CPU of this embodiment. A CPU shown in FIG. 16 mainly includes an arithmetic logic unit (ALU) 801, an ALU controller 802, an instruction decoder 803, an interrupt controller 804, a timing controller 805, a register 806, a register controller 807, a bus interface (Bus I/F) 808, a memory 809 and a memory interface 820, over a substrate 800. The memory 809 and the memory interface 820 may be provided over another chip. Of course, the CPU shown in FIG. 16 is only an example in which the configuration is simplified, and an actual CPU may have various configurations depending on the uses.

Instructions inputted to the CPU through the bus interface 808 is decoded in the instruction decoder 803, and then inputted to the ALU controller 802, the interrupt controller 804, the register controller 807 and the timing controller 805. The ALU controller 802, the interrupt controller 804, the register controller 807 and the timing controller 805 conduct various controls based on the decoded instructions. Specifically, the ALU controller 802 generates signals for controlling the operation of the ALU 801. While the CPU is executing a program, the interrupt controller 804 judges an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates signals for controlling timing of operation of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies an internal clock signal to the above-described various circuits.

In the CPU which is one of semiconductor devices of the present invention, an integrated circuit is formed using a substrate having an insulating surface or a single-crystal semiconductor layer (an SOI layer) which is bonded onto an insulating substrate; therefore, not only faster processing speed but also lower power consumption can be achieved. Further, using a transistor in which junction capacitance is suppressed makes it possible to drive the CPU at high speed. Furthermore, since the CPU has cavities which are in contact with a semiconductor film, heat generated in driving the transistor can be released efficiently. Thus, malfunction, destruction of an element, or the like due to self-heating can be prevented.

In addition, since a semiconductor substrate is less prone to shrink due to heat treatment and a semiconductor substrate has a less undulated surface, than a glass substrate. Accordingly, when a semiconductor substrate is used as a base substrate, alignment accuracy of a mask can be increased; thus, an ultrafine pattern of 100 nm or less can be formed. Accordingly, when a semiconductor substrate is used as a base substrate, a mask having high elaboration can be used, and thus, channel length L of the transistor can be shorter. Thus, high performance, low power consumption, and high integration can be realized, which makes it possible to manufacture large-scale integrated circuits (LSI) including a CPU.

This embodiment can be implemented in combination with any of the above-described embodiment modes and the embodiments as appropriate.

Embodiment 5

In this embodiment mode, a procedure in the case of forming a plurality of semiconductor devices with the use of one base substrate will be described.

Figure 17A:
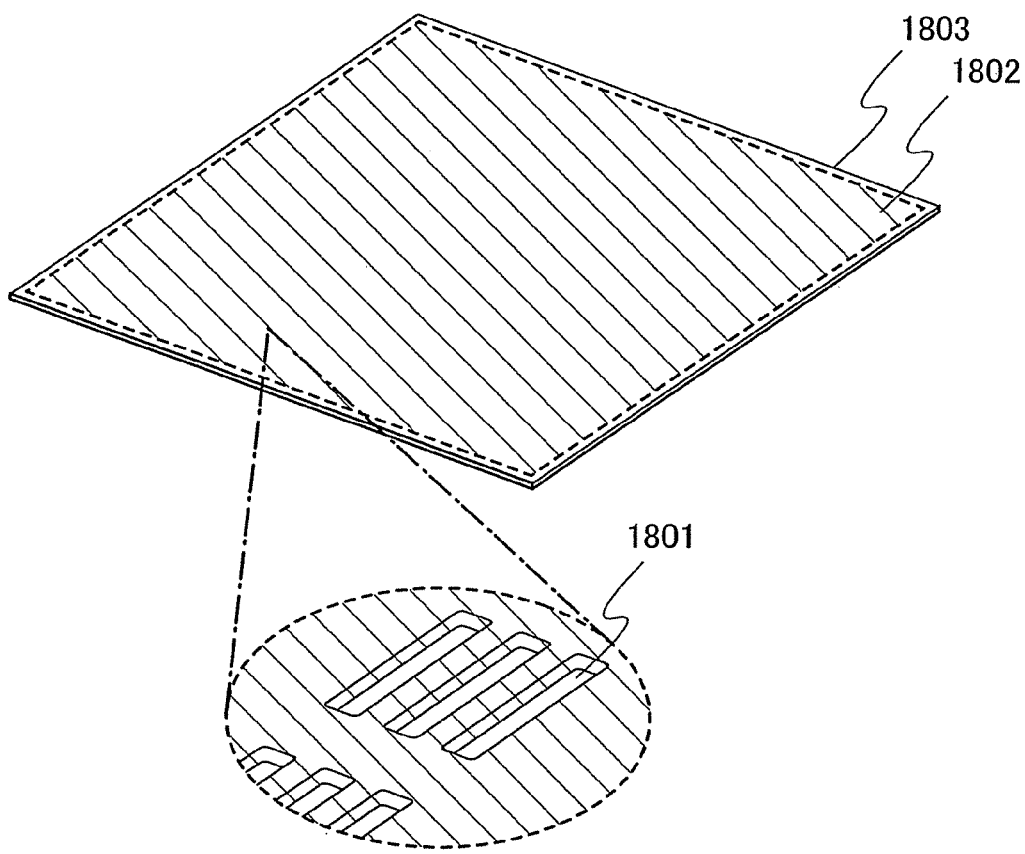
FIGS. 17A and 17B are diagrams showing a manufacturing method of a semiconductor device of the present invention.

In FIG. 17A, an external appearance of a base substrate 1803 over which an insulating film 1802 including an opening 1801 is shown. FIG. 17A also shows a view in which a surface of the base substrate 1803 is partially enlarged.

Figure 17B:
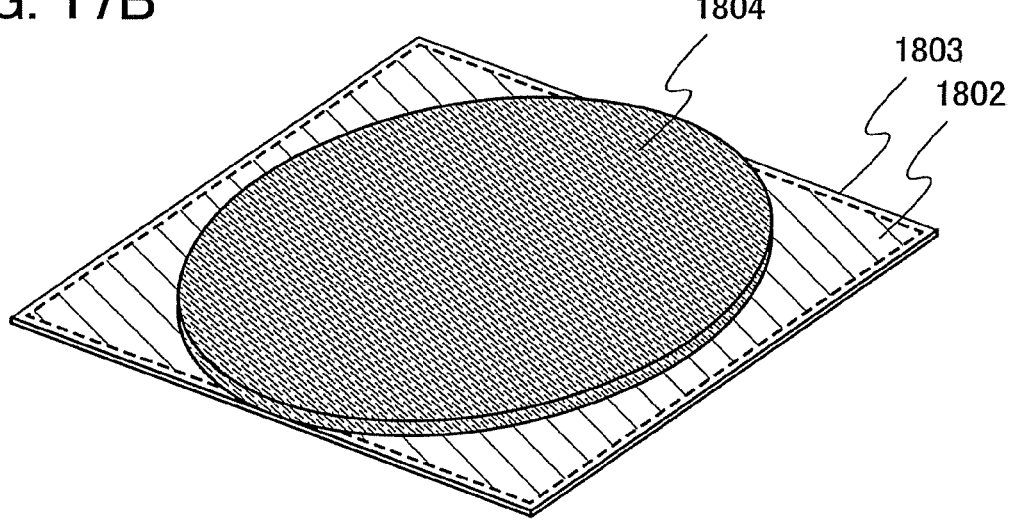

Next, as shown in FIG. 17B, a bond substrate 1804 is bonded to the base substrate 1803 by bonding. The bond substrate 1804 is bonded to the base substrate 1803 so that the insulating film 1802 including the opening 1801 is interposed between the bond substrate 1804 and the base substrate 1803.

Figure 18A:
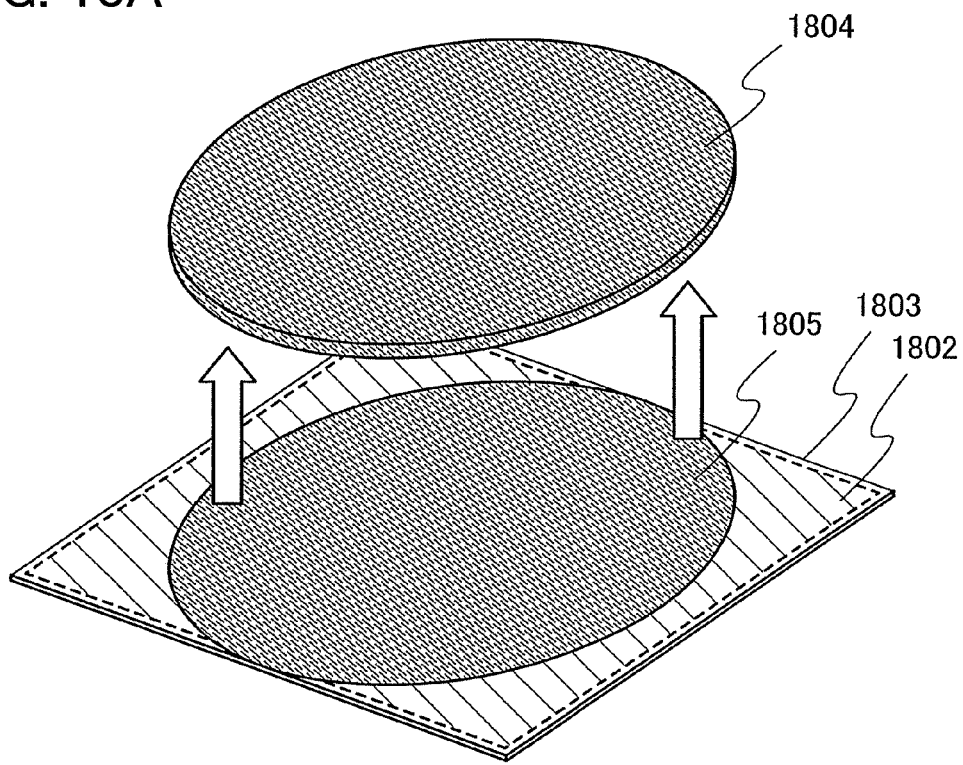
FIGS. 18A and 18B are diagrams showing a manufacturing method of a semiconductor device of the present invention.
Figure 18B:
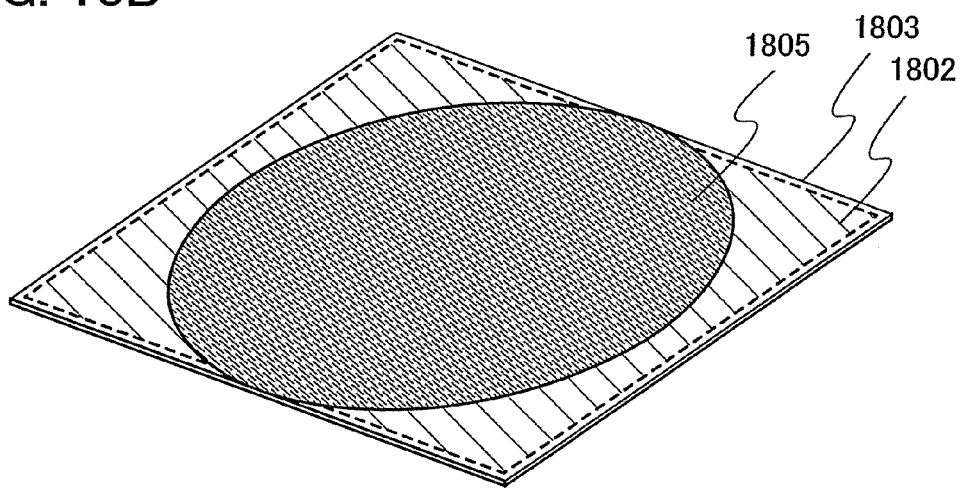
Figure 19:
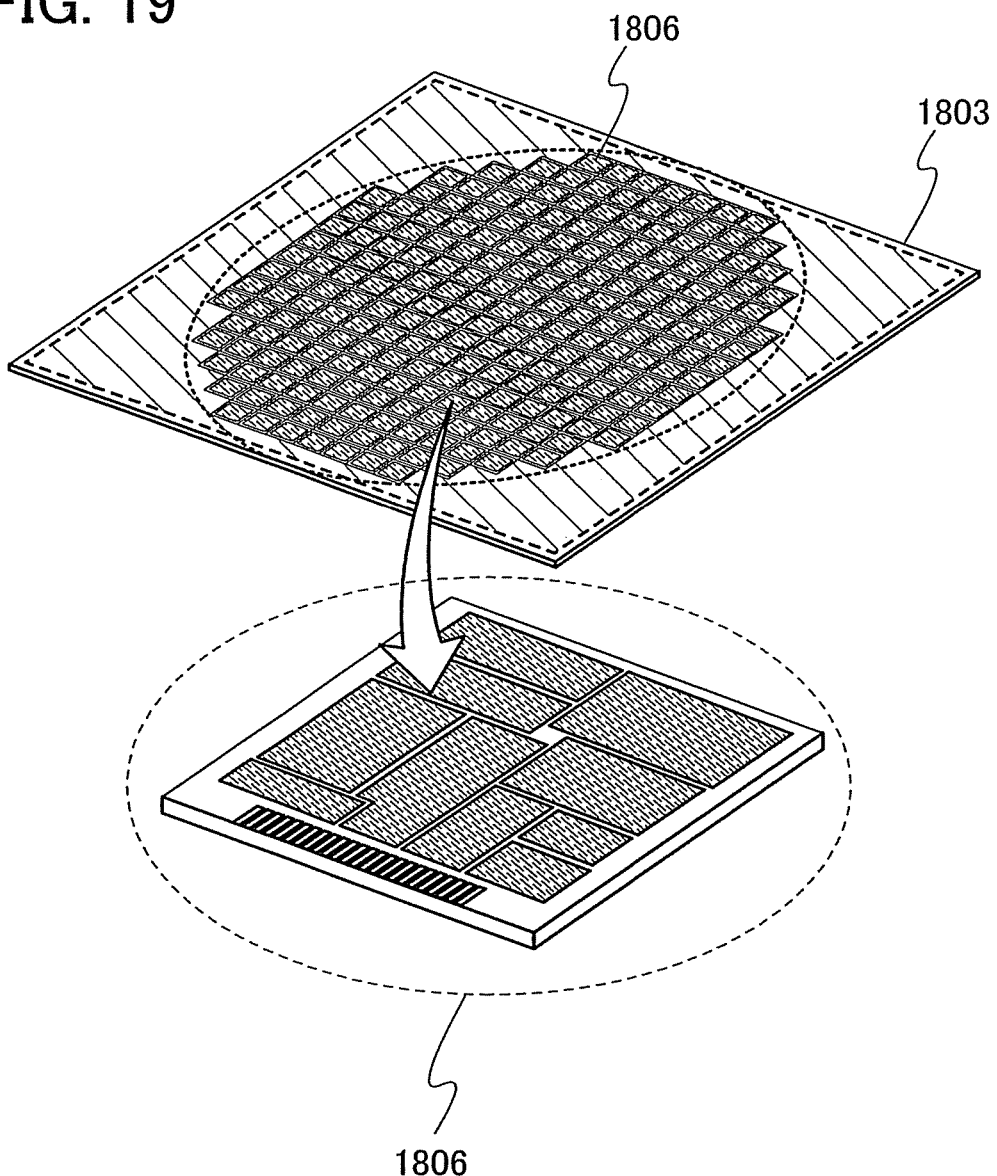
FIG. 19 is a diagram showing a manufacturing method of a semiconductor device of the present invention.

Then, the bond substrate 1804 is split as shown in FIG. 18A, whereby a semiconductor film 1805 which is part of the bond substrate 1804 is transferred to the base substrate 1803 as shown in FIG. 18B. A cavity formed with the opening 1801 included in the insulating film 1802 is provided between the semiconductor film 1805 and the base substrate 1803.

Then, a plurality of semiconductor devices 1806 is formed using the semiconductor film 1805 formed over the base substrate 1803, and the semiconductor devices 1806 are separated with base substrate 1803 by dicing or the like. The above-described structure makes it possible to manufacture the plurality of semiconductor devices 1806.

Note that, although the case where a pair of the base substrate 1803 and the bond substrate 1804 is bonded to each other is described in this embodiment mode, the present invention is not limited to this structure. A plurality of bond substrates 1804 may be bonded to one base substrate 1803. Note that, in this case, plane orientations of the bond substrates 1804 are aligned, whereby crystal plane orientations of a plurality of semiconductor films formed over the base substrate 1803 can be aligned; thus, characteristics of the semiconductor devices 1806 can be uniform.

This embodiment can be implemented in combination of the above-described embodiment mode or the above-described embodiment as appropriate.

Embodiment 6

Figure 20A:
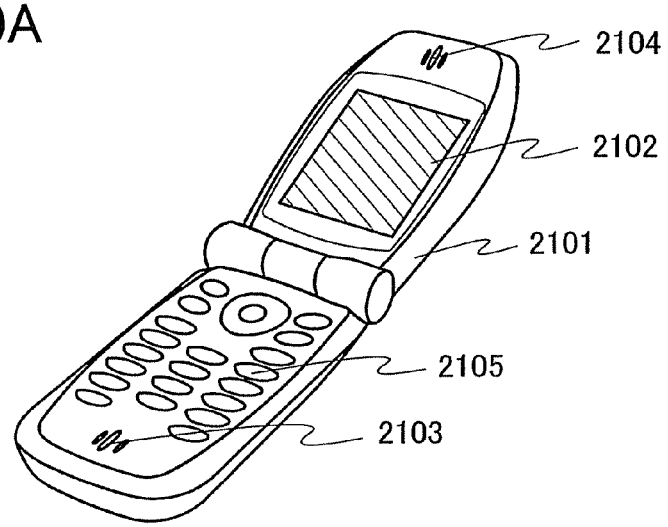
FIGS. 20A to 20C are diagrams of electronic appliances in each of which a semiconductor device of the present invention is used.
Figure 20B:
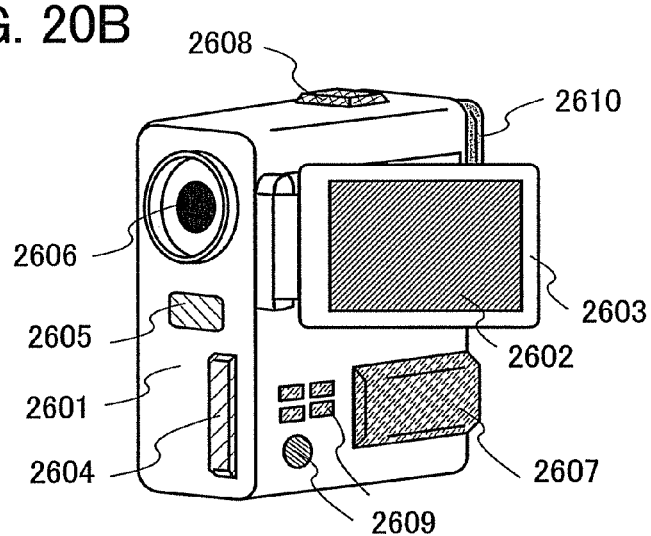
Figure 20C:
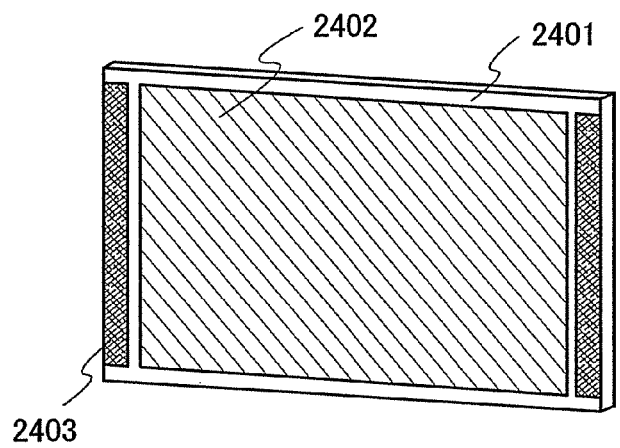

As an electronic device which can use the semiconductor device of the present invention, the following can be given: mobile phones, portable game machines, electronic books, cameras such as video cameras or digital still cameras, goggle displays (head mounted displays), navigation systems, audio reproducing devices (e.g., car audio components or audio component sets), laptop computers, image reproducing devices provided with a recording medium (typically, devices for reproducing a recording medium such as digital versatile discs (DVDs) and having a display for displaying the reproduced image), and the like. FIG. 20A to FIG. 20C show specific examples of these electronic devices.

FIG. 20A shows a mobile phone, which includes a main body 2101, a display portion 2102, an audio input portion 2103, an audio output portion 2104, and operation keys 2105. The display device of the present invention is used for the display portion 2102, whereby a highly-reliable and high-performance mobile phone in which power consumption can be suppressed can be obtained.

FIG. 20B shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. The display device of the present invention is used for the display portion 2602, whereby a highly-reliable and high-performance video camera in which power consumption can be suppressed can be obtained.

FIG. 20C shows an image display device, which includes a housing 2401, a display portion 2402, speaker portions 2403, and the like. The display device of the present invention is used for the display portion 2402, whereby a highly-reliable and high-performance image display device in which power consumption can be suppressed can be obtained. Note that the image display device corresponds to all image display devices for displaying images, such as those for personal computers, television broadcast reception, and advertisement display.

As described above, the application range of the present invention is extremely wide and the present invention can be applied to electronic devices in all fields.

This embodiment can be implemented in combination with any of the above-described embodiment modes and the embodiments as appropriate.

This application is based on Japanese Patent Application serial no. 2007-118086 filed with Japan Patent Office on Apr. 27, 2007, the entire contents of which are hereby incorporated by reference.

What is claimed is:

1. A method for manufacturing a semiconductor device, comprising the steps of:
   forming a first insulating film including first and second openings over a base substrate;
   bonding a bond substrate to the base substrate with the first insulating film interposed therebetween;
   fixing a semiconductor film which is a part of the bond substrate to the first insulating film;
   processing the fixed semiconductor film into a desired shape;
   forming a gate insulating film over the fixed semiconductor film including a channel formation region;
   forming a gate electrode over the gate insulating film;
   forming a second insulating film over the fixed semiconductor film;
   forming a third opening in the second insulating film;
   forming a wiring over the second insulating film, the wiring being electrically connected to the fixed semiconductor film through the third opening,
   wherein the channel formation region of the semiconductor film overlaps with the first and second openings.

2. The method for manufacturing a semiconductor device according to claim 1, wherein the base substrate is a semiconductor substrate.

3. The method for manufacturing a semiconductor device according to claim 1, wherein the bond substrate is a semiconductor substrate.

4. The method for manufacturing a semiconductor device according to claim 1, wherein third opening overlaps with at least one of the first and second openings.

5. The method for manufacturing a semiconductor device according to claim 1, wherein the semiconductor film includes the channel formation region between lightly doped drain regions, and
   wherein the lightly doped drain regions overlap with the first and second openings.

6. The method for manufacturing a semiconductor device according to claim 1, wherein the channel formation region is on and in contact with the first insulating film.

7. A method for manufacturing a semiconductor device, comprising the steps of:
   forming a first insulating film over a base substrate;
   forming first openings in the first insulating film by etching;
   bonding a bond substrate to the base substrate with the first insulating film in which the first openings is formed interposed therebetween;
   fixing a semiconductor film which is a part of the bond substrate to the first insulating film; and
   processing the fixed semiconductor film into a desired shape;
   forming a gate insulating film over the fixed semiconductor film including a channel formation region;
   forming a gate electrode over the gate insulating film;
   forming a second insulating film over the fixed semiconductor film;
   forming a second opening in the second insulating film;
   forming a wiring over the second insulating film, the wiring being electrically connected to the fixed semiconductor film through the second opening,
   wherein the channel formation region of the semiconductor film overlaps with the first openings.

8. The method for manufacturing a semiconductor device according to claim 7, wherein the base substrate is a semiconductor substrate, and
   wherein the first insulating film is formed by thermal oxidation of the base substrate.

9. The method for manufacturing a semiconductor device according to claim 7, wherein the bond substrate is a semiconductor substrate.

10. The method for manufacturing a semiconductor device according to claim 7, wherein the semiconductor film includes the channel formation region between lightly doped drain regions, and
    wherein the lightly doped drain regions overlap with the first openings.

11. The method for manufacturing a semiconductor device according to claim 7, wherein the channel formation region is on and in contact with the first insulating film.

* * * * *